(12) United States Patent
Hiroshima et al.

(10) Patent No.: US 10,492,291 B2
(45) Date of Patent: Nov. 26, 2019

(54) WIRING BOARD MANUFACTURING METHOD

(71) Applicant: FUJITSU LIMITED, Kawasaki-shi, Kanagawa (JP)

(72) Inventors: Yoshiyuki Hiroshima, Nakano (JP); Akiko Matsui, Meguro (JP); Mitsuhiko Sugane, Ichikawa (JP); Takahide Mukoyama, Kamakura (JP); Tetsuro Yamada, Kawasaki (JP); Kohei Choraku, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 178 days.

(21) Appl. No.: 15/465,895

(22) Filed: Mar. 22, 2017

(65) Prior Publication Data

US 2017/0290144 A1 Oct. 5, 2017

(30) Foreign Application Priority Data

Mar. 30, 2016 (JP) .................................. 2016-068824

(51) Int. Cl.
*H05K 1/02* (2006.01)
*H05K 3/04* (2006.01)
*H05K 3/46* (2006.01)

(52) U.S. Cl.
CPC .......... *H05K 1/0271* (2013.01); *H05K 3/043* (2013.01); *H05K 3/4644* (2013.01); *H05K 2201/09381* (2013.01); *H05K 2201/09418* (2013.01)

(58) Field of Classification Search
CPC .. H05K 1/10; H05K 3/34; H05K 3/46; H05K 1/0271; H05K 3/043; H05K 3/4644; H05K 2201/09381; H05K 2201/09418
See application file for complete search history.

(56) References Cited

U.S. PATENT DOCUMENTS 7,834,273 B2 * 11/2010 Takahashi .............. H05K 1/115
257/774

FOREIGN PATENT DOCUMENTS

| JP | 8-51258 | | 2/1996 |
| JP | 11274707 | A * | 10/1999 |
| JP | 2008-4631 | | 1/2008 |
| JP | 2009-76721 | | 4/2009 |

* cited by examiner

*Primary Examiner* — Carl J Arbes
(74) *Attorney, Agent, or Firm* — Staas & Halsey LLP

(57) ABSTRACT

A wiring board manufacturing method includes forming a conductor pattern within a waste board section of a wiring board including a product section and the waste board section, the conductor pattern in which a plurality of polygonal lands made of a conductor are arranged along a first direction and a second direction crossing the first direction, each of the plurality of polygonal lands making contact with an adjacent one of the plurality of polygonal lands at each apex of the plurality of polygonal lands; and selectively removing the conductor at the apex of at least part of the plurality of polygonal lands.

10 Claims, 20 Drawing Sheets

FIG. 19

| WIRING BOARD | OUTER LAYERS | INNER LAYERS | LAND SHAPE | LAND SHIFT BETWEEN WIRING LAYERS | DRILLING | WARPAGE AMOUNT [mm] (AVERAGE VALUE) |
|---|---|---|---|---|---|---|
| FIRST WIRING BOARD | ZIGZAG SLIT | ARRANGE LANDS IN LATTICE | QUAD-RANGLE | NONE | ALL APEX POSITIONS OF LANDS | 4.17 |
| SECOND WIRING BOARD | ZIGZAG SLIT | ARRANGE LANDS IN LATTICE | QUAD-RANGLE | NONE | 1/4 | 3.62 |
| THIRD WIRING BOARD | ZIGZAG SLIT | ARRANGE LANDS IN LATTICE | QUAD-RANGLE | NONE | NONE | 4.52 |
| FOURTH WIRING BOARD | ZIGZAG SLIT | ARRANGE LANDS IN LATTICE | QUAD-RANGLE | 1/2 OF CYCLE | ALL APEX POSITIONS OF LANDS | 3.74 |
| FIFTH WIRING BOARD | ZIGZAG SLIT | ARRANGE LANDS IN LATTICE | TRIANGLE | NONE | ALL APEX POSITIONS OF LANDS | 3.73 |
| SIXTH WIRING BOARD | ZIGZAG SLIT (INVERSED BETWEEN L1 AND L2) | ARRANGE LANDS IN LATTICE | QUAD-RANGLE | NONE | ALL APEX POSITIONS OF LANDS | 3.25 |
| SEVENTH WIRING BOARD | STRAIGHT-LINE SLIT | MESH STRUCTURE | --- | --- | NONE | 4.61 |

WIRING BOARD MANUFACTURING METHOD

CROSS-REFERENCE TO RELATED APPLICATION

This application is based upon and claims the benefit of priority of the prior Japanese Patent Application No. 2016-068824, filed on Mar. 30, 2016, the entire contents of which are incorporated herein by reference.

FIELD

The embodiments discussed herein are related to a wiring board manufacturing method.

BACKGROUND

A wiring board with insulating layers and wiring layers alternately laminated may be warped due to a difference in the coefficient of thermal expansion between the insulating layer and the wiring layer. Examples of related art for suppressing occurrence of warpage in the wiring board are as follows.

There is a technique in which, in a multilayered wiring board including wiring layers with a power supply plane formed thereon, the power supply plane is cut and divided along a cutting line, for example. It is also suggested that the cutting line is a zigzag line.

Moreover, there is a technique in which, in a printed wiring board configured of a circuit main body portion where a wiring pattern is formed and a waste board portion, hexagonal dummy patterns are arrayed in a honeycomb shape on the waste board section so as to be regularly spaced, thereby matching the residual copper rates of the circuit main body portion and the waste board portion. It is also suggested that dummy patterns of adjacent layers are arranged so as to be shifted in longitudinal and lateral directions by a half pitch.

Moreover, there is a technique in which, in a board base material sectioned into a product formation region and a waste board region, a reinforcing pattern with element patterns successively and regularly arranged thereon is formed on the waste board region.

Japanese Laid-open Patent Publication Nos. 2009-76721, 8-51258, and 2008-4631 are examples of related art.

SUMMARY

According to an aspect of the invention, a wiring board manufacturing method includes forming a conductor pattern within a waste board section of a wiring board including a product section and the waste board section, the conductor pattern in which a plurality of polygonal lands made of a conductor are arranged along a first direction and a second direction crossing the first direction, each of the plurality of polygonal lands making contact with an adjacent one of the plurality of polygonal lands at each apex of the plurality of polygonal lands; and selectively removing the conductor at the apex of at least part of the plurality of polygonal lands.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 19 is a diagram illustrating the results of the fabricated wiring boards.

DESCRIPTION OF EMBODIMENTS

Figure 1A:
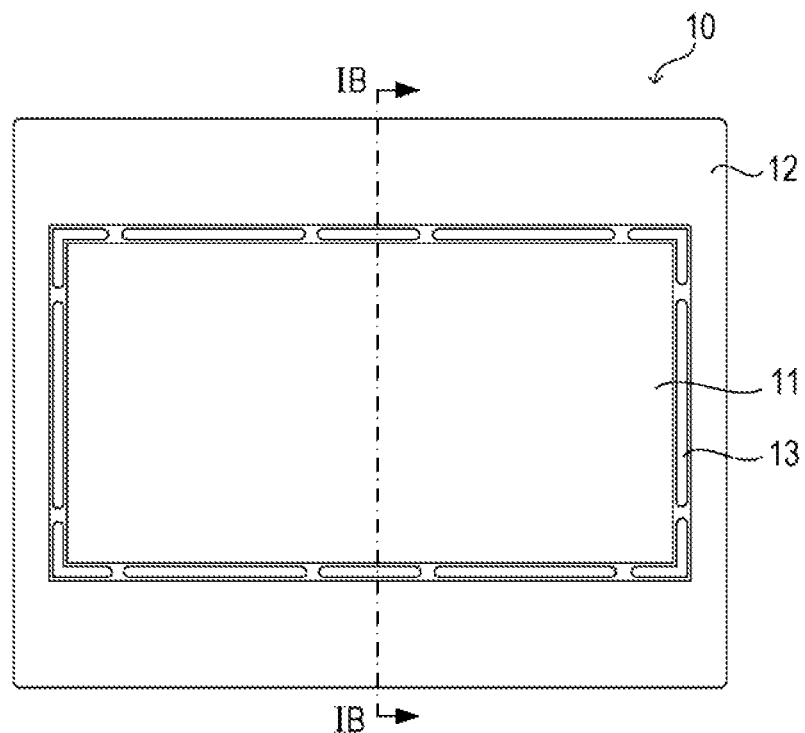
FIG. 1A is a plan view schematically depicting the structure of a wiring board according to an embodiment of the disclosure.

There is known a wiring board that includes a product section and a waste board section. The product section is a region for mounting components. The waste board section is arranged on an outer periphery of the product section and will be detached from the product section after the components are mounted on the product section. To suppress warpage of the wiring board, a slit is formed in a copper foil of the waste board section to divide the copper foil into a plurality of regions to suppress warpage occurring to the waste board section, thereby suppressing warpage occurring to the entire wiring board. However, when a slit is formed at the same position in each of a plurality of wiring layers of the wiring board, the wiring board may be bent at the slit formation position as a starting point. On the other hand, by forming a slit in a zigzag pattern, occurrence of a bending point may be suppressed. Even in this case, however, when all layers are viewed as a whole, structure in which portions where the copper foil is removed (that is, portions only with resin) are linearly stacked is still the same, and warpage may not be sufficiently suppressed.

Moreover, in related art, an artwork film has to be repeatedly created and evaluated to find an optimum conductor pattern capable of suppressing warpage of the wiring board, and it takes enormous amount of time and efforts to arrive at the optimum conductor pattern.

Therefore, it is desired to provide a wiring board manufacturing method capable of suppressing warpage of a wiring board more simply and effectively than ever.

Hereinafter, examples of embodiments of the disclosure are described with reference to the drawings. Note that identical or equivalent components and portions are provided with the same reference character in the drawings and redundant description is omitted as appropriate.

Figure 1B:
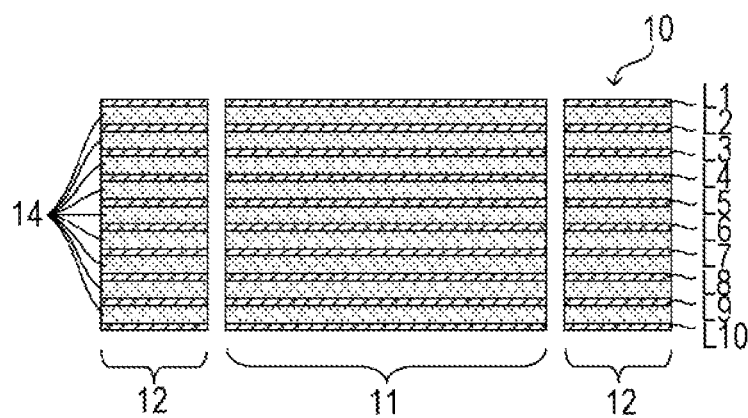
FIG. 1B is a sectional view along an IB-IB line in FIG. 1A.

FIG. 1A is a plan view schematically depicting the structure of a wiring board 10 according to an embodiment of the disclosure, and FIG. 1B is a sectional view along an IB-IB line in FIG. 1A. Note that the wiring board 10 may be used as a component of any electronic equipment, for example, a server system, network system, personal computer, smartphone, and other household electrical appliances.

The wiring board 10 includes a product section 11 and a waste board section 12 provided on an outer periphery of the product section 11. The product section 11 is a portion as a product with electronic components mounted thereon, and the waste board section 12 is a portion to be detached from the product section 11 after the components are mounted on the product section 11. Between the product section 11 and the waste board section 12, through holes 13 as perforations formed by router processing or the like are provided. The product section 11 and the waste board section 12 are separated by the through holes 13.

As depicted in FIG. 1B, the wiring board 10 is a multi-layered wiring board with a plurality of wiring layers L1 to L10 provided in each of the product section 11 and the waste board section 12. On the wiring layers L1 to L10, for example, a wiring made of a conductor such as a copper foil is formed. The wiring layers L1 to L10 are separated from one another by insulating layers 14 made of a composite material obtained by, for example, impregnating glass fiber with epoxy resin. Note that although the wiring board with ten wiring layers is exemplarily depicted in FIG. 1B, the number of wiring layers may be increased or decreased as appropriate. Also, FIG. 1B is used to schematically depict a layer structure of the wiring board 10 and does not depict the structure of conductor patterns in the wiring layers L1 to L10.

Electronic components to be mounted on the product section 11 are coupled to the product section 11 by soldering. Thus, after the electronic components are mounted on the product section 11, the wiring board 10 including the product section 11 and the waste board section 12 is put on a belt conveyor to flow inside a reflow furnace. Since the wiring board 10 has a difference in the coefficient of thermal expansion between the conductors on the wiring layers L1 to L10 and the insulating layers 14, warpage may occur in the course of heating and cooling by reflowing. In particular, the degree of warpage (warpage amount) is large when the front side and the back side of the wiring board have different residual copper rates or when the layers have different materials or thicknesses. Also, since the wiring board is warped in an arc shape with a radius determined by the material of the wiring board, as the area of the wiring board is larger, the warpage amount is larger. When the warpage amount of the wiring board is large, problems may arise such that electronic component soldering become defective or the wiring board after electrical components are mounted does not fit in a housing for accommodating the wiring board.

In view of suppressing warpage of the wiring board 10, the waste board section 12 are desired, firstly, to suppress warpage of the product section 11 by the stiffness of the waste board section 12 itself and, secondly, to suppress warpage of the wiring board 10 as a whole by suppressing warpage of the waste board section 12 itself. By forming a conductor pattern on each of the wiring layers L1 to L10 in the waste board section 12 so as to satisfy the above-mentioned two points, warpage of the wiring board 10 may be suppressed.

Figure 2A:
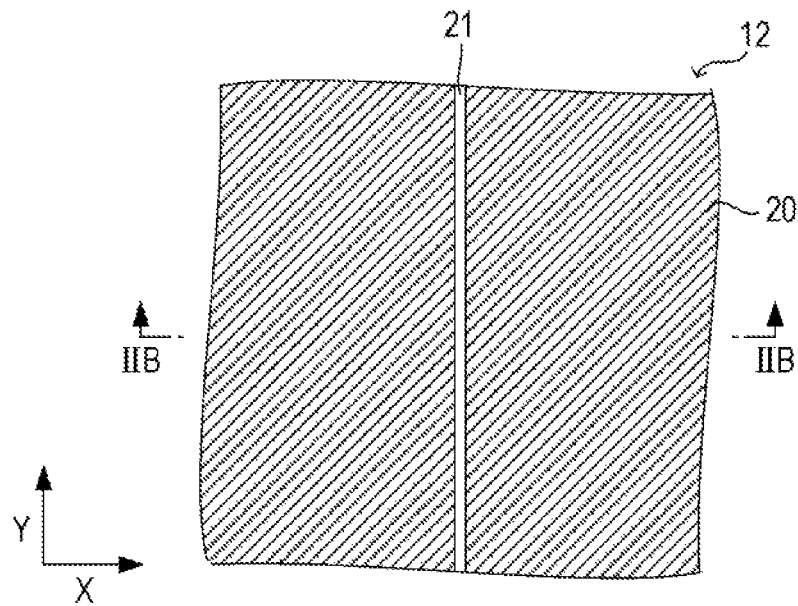
FIG. 2A is a plan view of a conductor pattern of a waste board section according to a first comparative example.
Figure 2B:
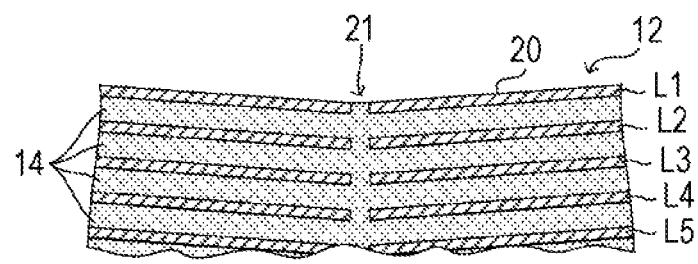
FIG. 2B is a sectional view along an IIB-IIB line in FIG. 2A.

FIG. 2A is a plan view of a conductor pattern of the waste board section 12 according to a first comparative example. FIG. 2B is a sectional view along an IIB-IIB line in FIG. 2A. In the example depicted in FIG. 2A and FIG. 2B, a slit 21 extending in a straight line along a Y direction is formed in a conductor 20 on each of the wiring layers L1 to L10 of the waste board section 12. The slits 21 are provided in the respective wiring layers L1 to L10 at positions matched one another. In this manner, by providing the slit 21 in the conductor 20 of the waste board section 12 to divide the conductor 20, the length of a portion where the conductor 20 continues is shortened, and therefore it is possible to expect an effect of suppressing warpage of the wiring board due to the difference in the coefficient of thermal expansion between the insulating layers 14 and the conductors 20. However, when the slits 21 are provided in the wiring layers L1 to L10 at positions matched one another, the conductors 20 are not present at the formation positions of the slits 21, and only the composite material configuring the insulating layers 14 is present. In the portion where the conductors 20 are not present, stiffness is decreased. Therefore, as depicted in FIG. 2B, the wiring board may be bent along the line of the slits 21.

Figure 3:
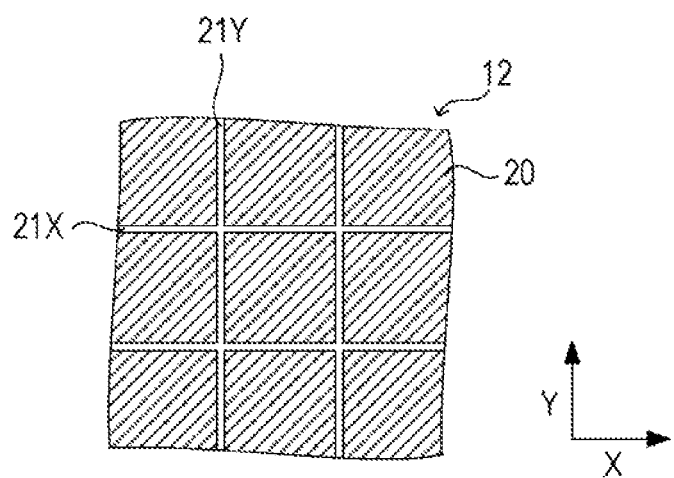
FIG. 3 is a plan view of a conductor pattern of the waste board section according to a second comparative example.

FIG. 3 is a plan view of a conductor pattern of the waste board section 12 according to a second comparative example. In the example depicted in FIG. 3, slits in a mesh structure, in which slits 21X each extending in a straight line along an X direction and slits 21Y each extending in a straight line along a Y direction cross one another, are formed in a conductor 20 of each of the wiring layers L1 to L10 of the waste board section 12. The slits 21X and 21Y are provided in the respective wiring layers L1 to L10 at positions matched one another. In this manner, by forming slits in a mesh structure in the conductor 20, an effect of suppressing warpage of the wiring board in both of the X and Y directions may be expected. However, even when slits in a mesh structure as described above are formed, the conductors 20 are not present at the formation positions of the slits 21X and 21Y, and only the composite material configuring the insulating layers 14 is present. Therefore, the wiring board may be bent along the formation positions of the slits 21X and 21Y.

First Embodiment

Figure 4A:
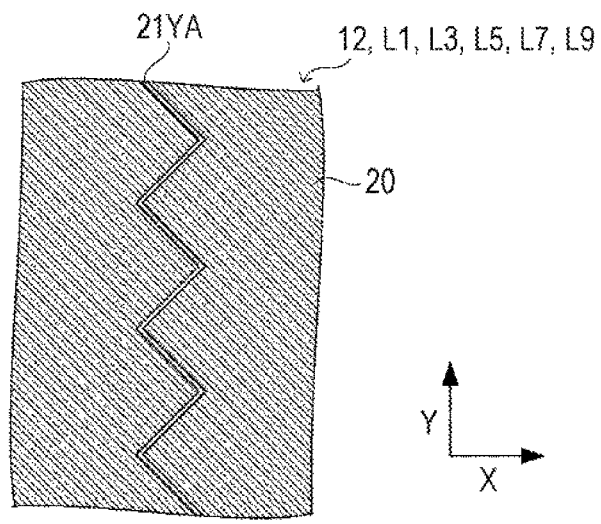
FIG. 4A is a plan view of a conductor pattern formed on an odd-numbered wiring layer of the waste board section according to an embodiment of the disclosure.
Figure 4B:
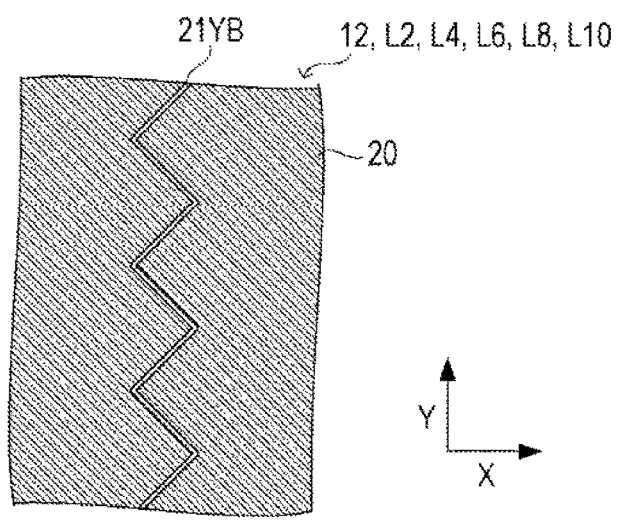
FIG. 4B is a plan view of a conductor pattern formed on an even-numbered wiring layer of the waste board section according to the embodiment of the disclosure.
Figure 4C:
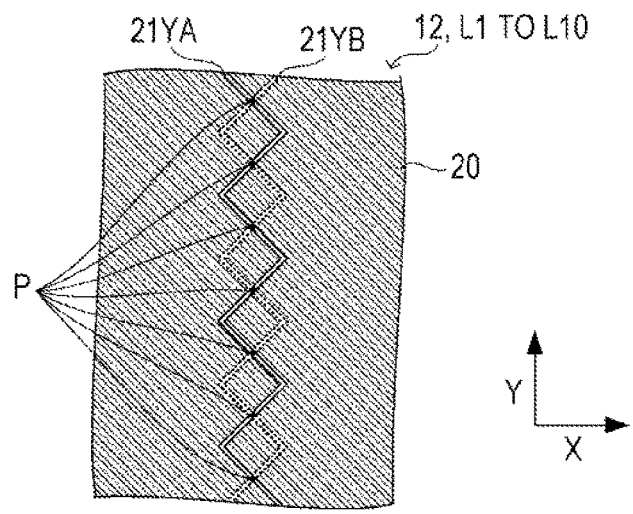
FIG. 4C is a diagram depicting the stacked conductor patterns of all wiring layers of the waste board section according to the embodiment of the disclosure.

FIG. 4A, FIG. 4B, and FIG. 4C are plan views of conductor patterns of the waste board section 12 according to a first embodiment. Specifically, FIG. 4A is a plan view of a conductor pattern formed on each of odd-numbered wiring layers L1, L3, L5, L7, and L9 of the waste board section 12. FIG. 4B is a plan view of a conductor pattern formed on each of even-numbered wiring layers L2, L4, L6, L8, and L10 of the waste board section 12. FIG. 4C is a diagram depicting the stacked conductor patterns of all of the wiring layers L1 to L10 of the waste board section 12.

Figure 5:
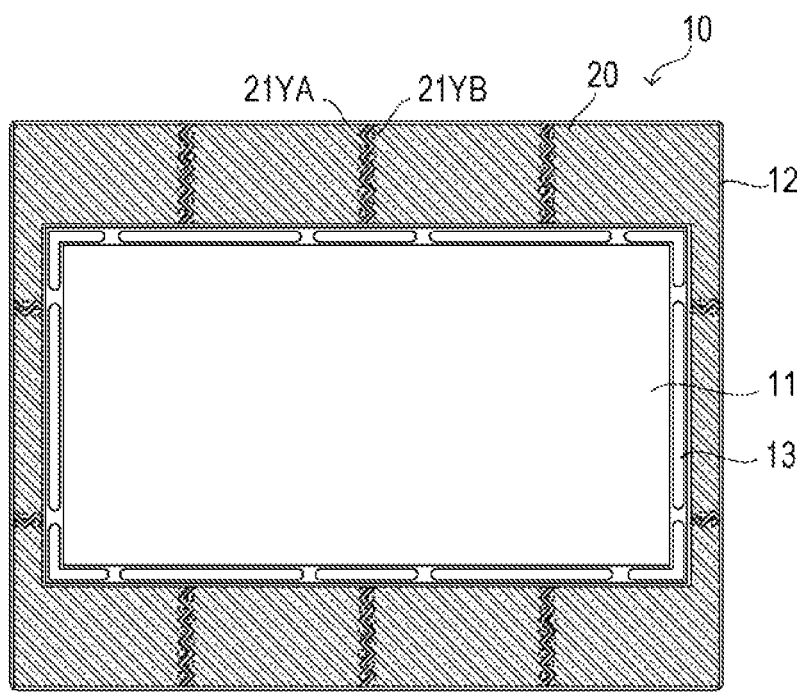
FIG. 5 is a plan view schematically depicting the structure of a wiring board according to the embodiment of the disclosure.

As depicted in FIG. 4A, on each of the odd-numbered wiring layers L1, L3, L5, L7, and L9 of the waste board section 12, a conductor pattern including a slit 21YA in a zigzag pattern extending in the Y direction is formed. Also, as depicted in FIG. 4B, on each of the even-numbered wiring layers L2, L4, L6, L8, and L10 of the waste board section 12, a conductor pattern including a slit 21YB in a zigzag pattern extending in the Y direction is formed. The slit 21YB formed on each even-numbered wiring layer has a zigzag pattern shifted in the Y direction with respect to the zigzag pattern of the slit 21YA formed on each odd-numbered wiring layer. In the present embodiment, a case is exemplarily described in which the zigzag pattern of the slit 21YB of each even-numbered wiring layer is shifted in the Y direction with respect to the zigzag pattern of the slit 21YA of each odd-numbered wiring layer by a shift amount corresponding to a half of a repetition cycle of the zigzag pattern. Note that the slits 21YA and 21YB are preferably formed at a plurality of locations of the waste board section 12 to divide the conductor 20 of the waste board section 12 into a plurality of portions, as depicted in FIG. 5.

Note that while a case is exemplarily described in which the conductor pattern including the slit 21YA is provided to each odd-numbered wiring layer and the conductor pattern including the slit 21YB is provided to each even-numbered wiring layer in the present embodiment, wiring layers to which these conductor patterns are provided may be changed as appropriate.

As described above, the wiring board manufacturing method of the first embodiment of the disclosure includes the following: (1) forming a conductor pattern in any of the wiring layers of the waste board section 12, the conductor pattern including the slit 21YA in a zigzag pattern extending in the Y direction; and (2) forming a conductor pattern in another wiring layer of the waste board section 12, the conductor pattern including the slit 21YB in a zigzag pattern shifted in the Y direction with respect to the zigzag pattern of the slit 21YA and extending in the Y direction.

In this manner, with the slits 21YA and 21YB formed in the wiring layers each being in a zigzag pattern, compared with the slit extending in a straight line as depicted in FIG. 2A, bending of the wiring board at the formation positions of the slits may be suppressed. Furthermore, with the zigzag patterns shifted among the wiring layers, as depicted in FIG. 4C, even when the slits 21YA and 21YB are arranged as being stacked, a portion P where the conductors 20 are not present and only the composite material configuring the insulating layers 14 is present is in a dotted form. With this, compared with the slit extending in a straight line as depicted in FIG. 2A, the effect of suppressing warpage of the wiring board is further promoted.

Second Embodiment

Figure 6A:
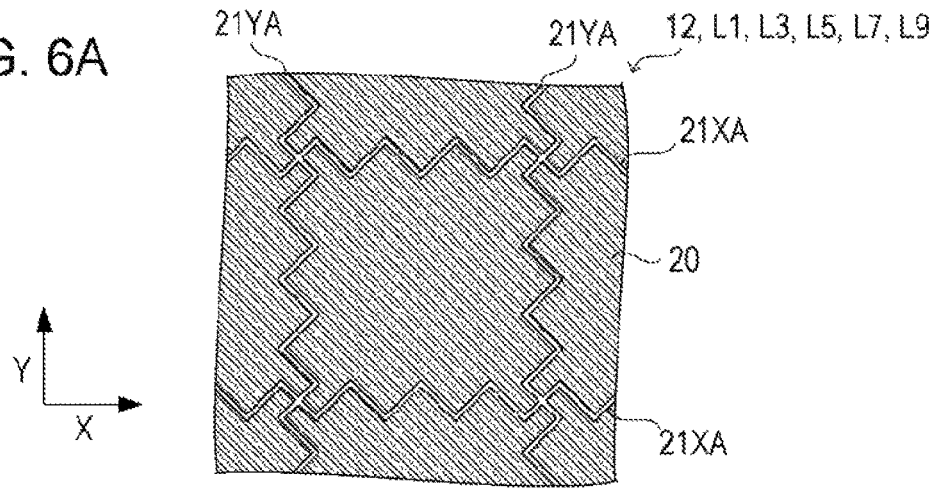
FIG. 6A is a plan view of a conductor pattern formed on an odd-numbered wiring layer of the waste board section according to an embodiment of the disclosure.
Figure 6B:
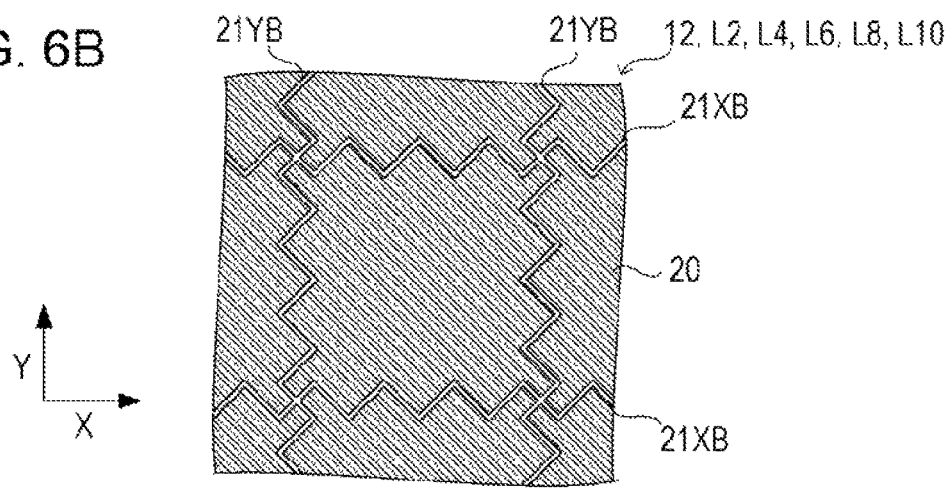
FIG. 6B is a plan view of a conductor pattern formed on an even-numbered wiring layer of the waste board section according to the embodiment of the disclosure.
Figure 6C:
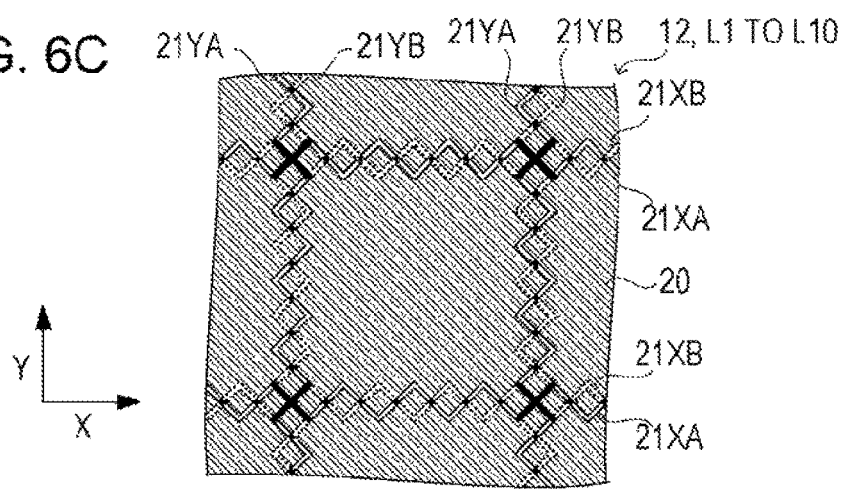
FIG. 6C is a diagram depicting the stacked conductor patterns of all wiring layers of the waste board section according to the embodiment of the disclosure.

FIG. 6A, FIG. 6B, and FIG. 6C are plan views of conductor patterns of the waste board section 12 according to a second embodiment of the disclosure. Specifically, FIG. 6A is a plan view of a conductor pattern formed on each of the odd-numbered wiring layers L1, L3, L5, L7, and L9 of the waste board section 12. FIG. 6B is a plan view of a conductor pattern formed on each of the even-numbered wiring layers L2, L4, L6, L8, and L10 of the waste board section 12. FIG. 6C is a diagram depicting the stacked conductor patterns of all of the wiring layers L1 to L10 of the waste board section 12.

As depicted in FIG. 6A, on each of the odd-numbered wiring layers of the waste board section 12, a conductor pattern including slits in a mesh structure in which the plurality of slits 21YA in a zigzag pattern extending in the Y direction and a plurality of slits 21XA in a zigzag pattern extending in the X direction cross one another is formed. Also, as depicted in FIG. 6B, on each of the even-numbered wiring layers of the waste board section 12, a conductor pattern including slits in a mesh structure in which a plurality of slits 21YB in a zigzag pattern extending in the Y direction and a plurality of slits 21X6 in a zigzag pattern extending in the X direction cross one another is formed.

Each slit 21YB formed in each even-numbered wiring layer has a zigzag pattern shifted in the Y direction with respect to the zigzag pattern of each slit 21YA formed in each odd-numbered wiring layer. Also, each slit 21X6 formed in each even-numbered wiring layer has a zigzag pattern shifted in the X direction with respect to the zigzag pattern of each slit 21XA formed in each odd-numbered wiring layer. In the present embodiment, a case is exemplarily described in which the zigzag pattern of the slit 21YB of each even-numbered wiring layer is shifted in the Y direction with respect to the zigzag pattern of the slit 21YA of each odd-numbered wiring layer by a shift amount corresponding to a half of a repetition cycle of the zigzag pattern and the zigzag pattern of the slit 21X6 of each even-numbered wiring layer is shifted in the X direction with respect to the zigzag pattern of the slit 21XA of each odd-numbered wiring layer by a shift amount corresponding to a half of the repetition cycle of the zigzag pattern.

Note that the wiring layers where the conductor pattern including the slits 21YA and 21XA is formed and the wiring layers where the conductor pattern including the slits 21YB and 21X6 is formed may be changed as appropriate.

As described above, the wiring board manufacturing method of the second embodiment of the disclosure includes the following: (1) forming a conductor pattern in any of the wiring layers of the waste board section 12, the conductor pattern including the slits 21YA in a zigzag pattern extending in the Y direction and the slits 21XA in a zigzag pattern extending in the X direction; and (2) forming a conductor pattern in another wiring layer of the waste board section 12, the conductor pattern including the slits 21YB and 21XB, where the slit 21YB includes a zigzag pattern shifted in the Y direction with respect to the zigzag pattern of the slit 21YA and extending in the Y direction and the slit 21X6 includes a zigzag pattern shifted in the X direction with respect to the zigzag pattern of the slit 21XA and extending in the X direction.

In this manner, with the slits in a mesh structure formed in each wiring layer each being in a zigzag pattern, compared with the slit pattern in a mesh structure extending in a straight line as depicted in FIG. 3, bending of the wiring board at the formation positions of the slits may be suppressed. Furthermore, with the zigzag patterns shifted among the wiring layers, even when the slits 21YA and the slits 21YB are arranged so as to be matched one another and the slits 21XA and the slits 21X6 are arranged so as to be matched one another, the portion P where only the composite material configuring the insulating layers 14 is present is in a dotted form, except a portion where the slits cross one another. With this, compared with the slits in a mesh structure depicted in FIG. 3, the effect of suppressing warpage of the wiring board is further promoted.

Third Embodiment

Figure 7A:
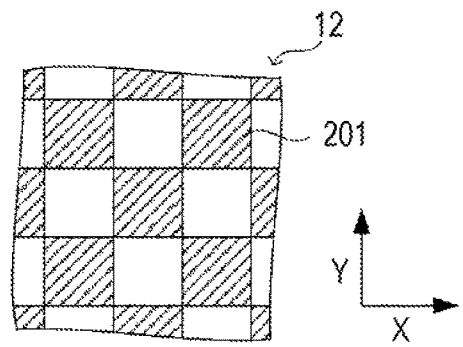
FIG. 7A is a plan view of a conductor pattern of the waste board section according to an embodiment of the disclosure.

FIG. 7A is a plan view of a conductor pattern of the waste board section 12 according to a third embodiment. As depicted in FIG. 7A, on the waste board section 12, a conductor pattern is formed in which a plurality of quadrangular (square) lands 201 configured of a conductor are cyclically arrayed along the X and Y directions so as to each make contact with an adjacent land 201 at each apex. That is, on each wiring layer of the waste board section 12, a conductor pattern of a so-called lattice pattern (also called a checkered pattern or checked pattern) is formed. In the present embodiment, conductor patterns of similar lattice patterns are provided on the wiring layers L1 to L10 of the waste board section 12 so as to be stacked one another. According to the conductor pattern of the lattice pattern as described above, each wiring layer of the waste board section 12 has a residual copper rate of 50%.

After the conductor pattern of the lattice pattern depicted in FIG. 7A is formed on the waste board section 12, depending on the state of occurrence of warpage of the wiring board 10, the conductor at an apex portion of any of the plurality of lands 201 is removed. With this, a junction with an adjacent land 201 is cut. Removal of the conductor at the apex portion of the land 201 may be performed by, for example, drilling by a drill. In this manner, by cutting a junction between lands, the length of a portion where the conductor continues is shortened. Therefore, warpage of the wiring board due to the difference in the coefficient of thermal expansion between the insulating layers 14 and the conductors may be suppressed.

Figure 7B:
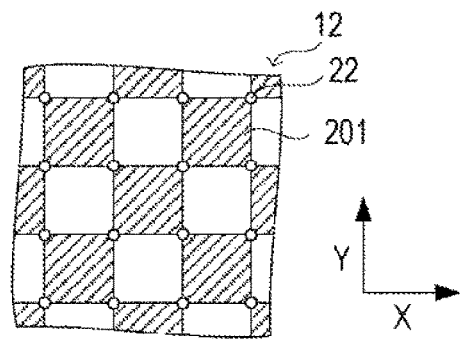
FIG. 7B is a diagram of a conductor pattern of the waste board section when through holes are formed in apex portions of a plurality of lands, according to the embodiment of the disclosure.

FIG. 7B exemplarily depicts a state in which each apex portion of the plurality of lands 201 formed on the waste board section 12 is drilled by a drill to form a through hole 22 to cut a junction between lands. By forming the through holes 22 by drilling by a drill in this manner, junctions between lands are collectively removed in the respective wiring layers L1 to L10.

Also, by drilling by a drill to remove the conductor, a portion where a junction between lands is cut is selectable as appropriate after formation of the conductor pattern. Therefore, a portion where a junction between lands is cut may be limited to a region where warpage occurs, thereby addressing local warpage occurring to the wiring board. For example, a region where warpage of the wiring board occurs may be estimated by simulation or experiment, and a portion in the estimated region where warpage occurs may be drilled to cut a junction between lands. On the other hand, a region where warpage does not occur may not be drilled to keep a junction between lands.

Figure 7C:
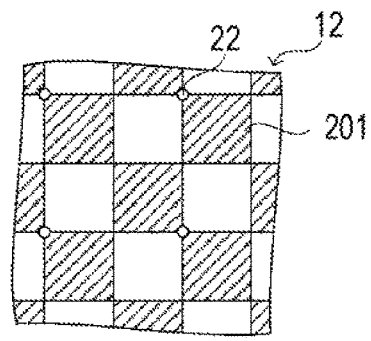
FIG. 7C is a diagram depicting a conductor pattern of the waste board section when through holes are formed in apex portions of a plurality of lands, according to the embodiment of the disclosure.
Figure 7D:
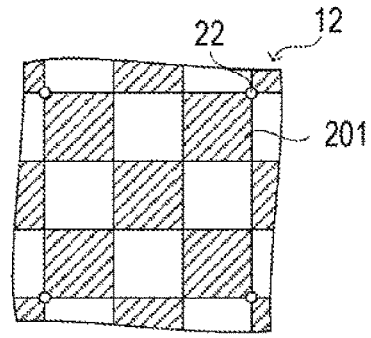
FIG. 7D is a diagram depicting a conductor pattern of the waste board section when through holes are formed in apex portions of a plurality of lands, according to the embodiment of the disclosure.

Furthermore, a portion in a region where warpage is relatively large may be drilled at relatively high density, and a portion in a region where warpage is relatively small may be drilled at relatively low density. For example, in a region where warpage is relatively large, as depicted in FIG. 7B, the through holes 22 may be formed at all of the apex portions of the plurality of lands 201 so that the density of the through holes 22 is at maximum. On the other hand, in a region where warpage is moderate, as depicted in FIG. 7C, the density of the through holes 22 may be set lower than that in the case of FIG. 7B. Also, in a region where warpage is relatively small, as depicted in FIG. 7D, the density of the through holes 22 may be further lowered.

Note that while the case has been exemplarily described in the present embodiment in which the conductor pattern including the plurality of lands 201 is formed on each of the wiring layers L1 to L10 of the waste board section 12, the conductor pattern including the plurality of lands 201 may be formed on at least one wiring layer. Also, the conductor pattern including the plurality of lands 201 may be applied to any of the wiring layers, and the conductor pattern according to the above-described first or second embodiment may be applied to another wiring layer.

As described above, the wiring board manufacturing method of the third embodiment of the disclosure includes the following: (1) forming a conductor pattern on the waste board section 12 of the wiring board 10, the conductor pattern in which the plurality of quadrangular lands 201 configured of a conductor are arranged along the X and Y directions so as to each make contact with an adjacent land at each apex; and (2) selectively removing the conductor at an apex portion of at least part of the plurality of lands 201.

According to the wiring board manufacturing method of the third embodiment of the disclosure, after the conductor pattern including the plurality of lands 201 is formed on the waste board section 12, depending on the state of occurrence of warpage, a junction between lands is cut as appropriated. With this, warpage of the wiring board 10 may be suppressed. Therefore, compared with the scheme of related art for optimizing the conductor pattern, warpage of the wiring board may be easily suppressed at low cost. That is, in the scheme of related art, an artwork film has to be repeatedly created and evaluated to find an optimum conductor pattern capable of suppressing warpage of the wiring board. By contrast, according to the wiring board manufacturing method of the present embodiment, warpage of the wiring board may be suppressed by selecting a location where a junction between lands is to be cut (that is, a location to be drilled). Therefore, the conductor pattern of the waste board section 12 does not have to be changed, and thus the artwork film does not have to be changed. The location where a junction between lands is to be cut may be selected based on, for example, the result of simulation, experiment, or the like. When the simulation result is not appropriate or when the experiment result is not a typical result, the location where a junction between lands is to be cut may be corrected to address the situation.

Also, according to the wiring board manufacturing method of the third embodiment of the disclosure, the location where a junction between lands is to be cut may be limited to a region where warpage occurs, thereby addressing local warpage occurring to the wiring board. Also, by changing the formation density of portions to be drilled, the situation may be addressed in accordance with the magnitude of warpage.

Fourth Embodiment

Figure 8A:
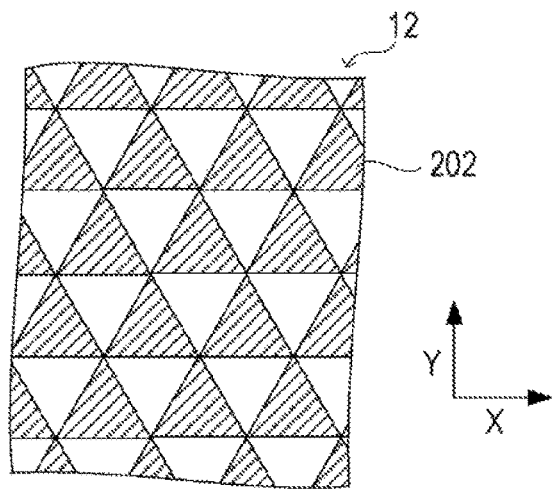
FIG. 8A is a plan view of a conductor pattern of the waste board section according to an embodiment of the disclosure.

FIG. 8A is a plan view of a conductor pattern of the waste board section 12 according to a fourth embodiment of the disclosure. As depicted in FIG. 8A, on the waste board section 12, a conductor pattern is formed in which a plurality of triangular (equilateral triangular) lands 202 configured of a conductor are cyclically arrayed along the X and Y directions so as to each make contact with an adjacent land 202 at each apex. That is, on the waste board section 12, a conductor pattern is formed in which the quadrangular lands 201 according to the above-described third embodiment are replaced by the triangular lands 202. In the present embodiment, similar conductor patterns are provided on each of the wiring layers L1 to L10 of the waste board section 12 so as to be stacked. According to the conductor pattern as described above, each wiring layer of the waste board section 12 has a residual copper rate of 50%.

After the conductor pattern including the plurality of lands 202 depicted in FIG. 8A is formed on the waste board section 12, depending on the state of occurrence of warpage of the wiring board 10, the conductor at an apex portion of any of the plurality of lands 202 is removed. With this, a junction with an adjacent land 202 is cut. Removal of the conductor at the apex portion of the land 202 may be performed by, for example, drilling by a drill. In this manner, by cutting a junction between lands, the length of a portion where the conductor continues is shortened. Therefore, warpage of the wiring board due to the difference in the coefficient of thermal expansion between the insulating layers 14 and the conductors may be suppressed.

Figure 8B:
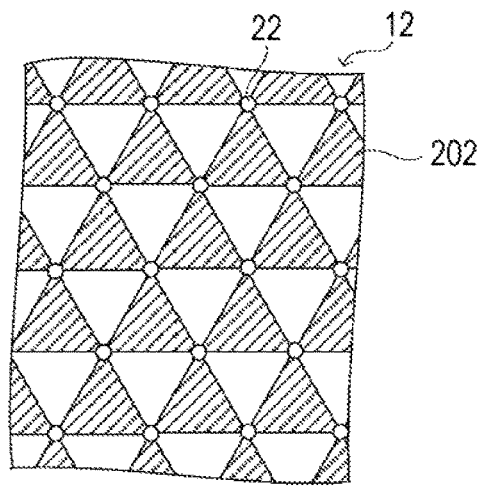
FIG. 8B is a diagram depicting a conductor pattern of the waste board section when through holes are formed in apex portions of a plurality of lands, according to the embodiment of the disclosure.

FIG. 8B exemplarily depicts a case in which all apex portions of the plurality of lands 202 formed on the waste board section 12 are drilled by a drill to form the through holes 22 to cut junctions between lands. By forming the through holes 22 by drilling by a drill in this manner, junctions between lands are collectively removed in the respective wiring layers L1 to L10.

Figure 8C:
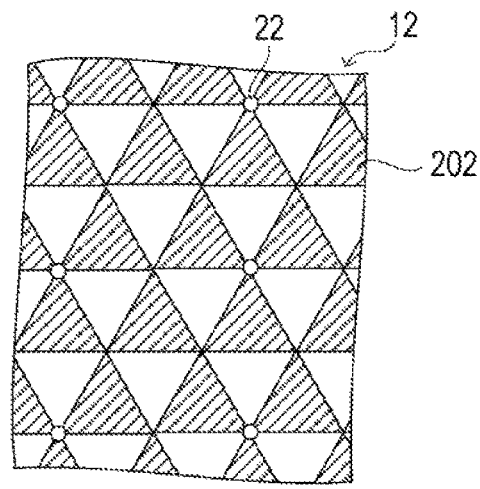
FIG. 8C is a diagram depicting a conductor pattern of the waste board section when through holes are formed in apex portions of a plurality of lands, according to the embodiment of the disclosure.

For example, in a region where warpage is relatively large, as depicted in FIG. 8B, the through holes 22 may be formed in all of the apex portions of the plurality of lands 202 so that the density of the through holes 22 is at maximum. On the other hand, in a region where warpage is relatively small, as depicted in FIG. 8C, the density of the through holes 22 may be lowered.

Note that while the case has been exemplarily described in the present embodiment in which the conductor pattern including the plurality of lands 202 is formed on each of the wiring layers L1 to L10 of the waste board section 12, the conductor pattern including the plurality of lands 202 may be formed on at least one wiring layer. Also, the conductor pattern according to the above-described first or second embodiment may be applied to any of the wiring layers.

As described above, the wiring board manufacturing method of the fourth embodiment of the disclosure includes the following: (1) forming a conductor pattern on the waste board section 12 of the wiring board 10, the conductor pattern in which the plurality of triangular lands 202 configured of a conductor are arranged along the X and Y directions so as to each make contact with an adjacent land at each apex; and (2) selectively removing the conductor at an apex portion of at least part of the plurality of lands 202.

According to the wiring board manufacturing method of the fourth embodiment of the disclosure, advantages similar to those according to the manufacturing method of the above-described third embodiment may be obtained. Also, with each land 202 being in a triangular shape compared with the quadrangular lands 201, the lands may be arranged in a closest-packed manner. With this, the number of junctions between lands may be increased to also address larger warpage occurring to the wiring board 10.

Fifth Embodiment

Figure 9A:
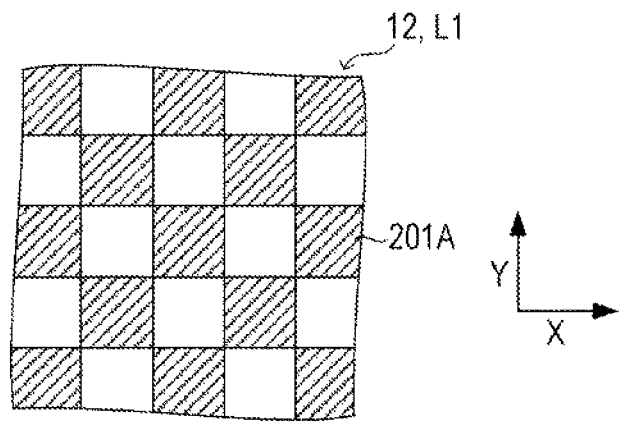
FIG. 9A is a plan view of a conductor pattern formed on a wiring layer L1 of the waste board section according to an embodiment of the disclosure.
Figure 9B:
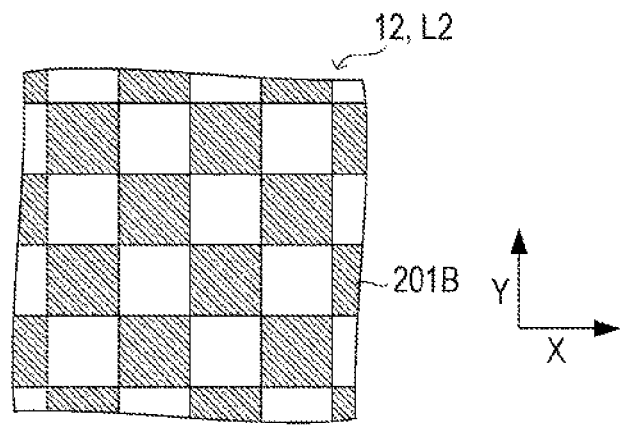
FIG. 9B is a plan view of a conductor pattern formed on a wiring layer L2 of the waste board section according to the embodiment of the disclosure.
Figure 9C:
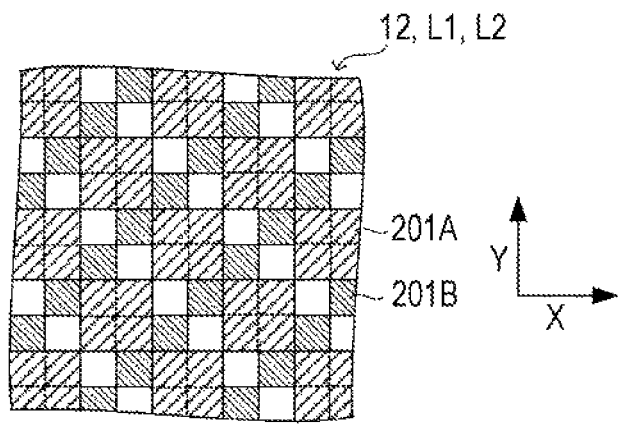
FIG. 9C is a diagram of the stacked conductor patterns of the wiring layers L1 and L2 of the waste board section according to the embodiment of the disclosure.

FIG. 9A, FIG. 9B, and FIG. 9C are plan views of conductor patterns on the respective wiring layers of the waste board section 12 according to a fifth embodiment of disclosure. Specifically, FIG. 9A is a plan view of a conductor pattern formed on the wiring layer L1 of the waste board section 12. FIG. 9B is a plan view of a conductor pattern formed on the wiring layer L2 of the waste board section 12. FIG. 9C is a diagram of the stacked conductor patterns of the wiring layers L1 and L2 of the waste board section 12. Note that while the conductor patterns on the other wiring layers L3 to L10 are not particularly limited, for example, the conductor pattern depicted in FIG. 9A may be formed on each odd-numbered wiring layer and the conductor pattern depicted in FIG. 9B may be formed on each even-numbered wiring layer. Also, the conductor pattern according to the above-described first or second embodiment may be applied to any of the wiring layers.

As depicted in FIG. 9A, on the wiring layer L1 of the waste board section 12, a conductor pattern of the lattice pattern is formed in which a plurality of quadrangular (square) lands 201A configured of a conductor are cyclically arrayed along the X and Y directions so as to each make contact with an adjacent land at each apex. Also, as depicted in FIG. 9B, also on the wiring layer L2 of the waste board section 12, a conductor pattern of the lattice pattern is formed in which a plurality of quadrangular (square) lands 201B configured of a conductor are cyclically arrayed along the X and Y directions so as to each make contact with an adjacent land at each apex.

The plurality of lands 201B formed on the wiring layer L2 are arranged so as to be shifted in the X and Y directions with respect to the plurality of lands 201A formed on the wiring layer L1 by a shift amount corresponding to a quarter of a repetition cycle of the plurality of lands. As described above, by shifting the arrangements of the lands 201A and the lands 201B in the X and Y directions by a one-quarter cycle, as depicted in FIG. 9C, the positions of the apexes of the lands 201A in the X and Y directions and the positions of the apexes of the lands 201B in the X and Y directions are shifted. That is, each junction between the lands 201A is positioned at the center of the land 201B or the center of a portion where no land 201B is formed, and each junction between the lands 201B is positioned at the center of the land 201A or the center of a portion where no land 201A is formed.

After the conductor pattern including the plurality of lands 201A and the conductor pattern including the plurality of lands 201B are formed on the wiring layers L1 and L2, respectively, of the waste board section 12, junctions between the lands are cut as appropriate in each of the wiring layers L1 and L2, thereby suppressing warpage of the wiring board 10. By shifting the positions of the lands 201A and the positions of the lands 201B from each other in the manner as described above, cutting junctions between the lands 201A and cutting junctions between the lands 201B are allowed to be independently performed.

Figure 10A:
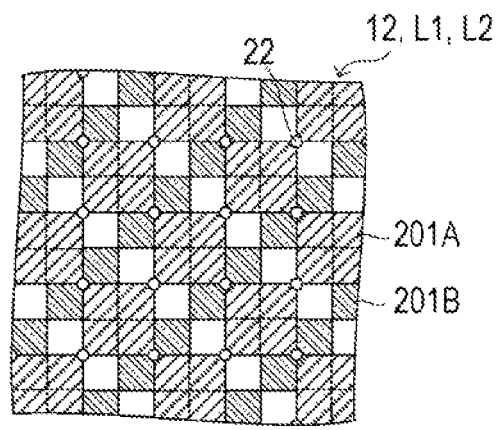
FIG. 10A is a diagram of the stacked conductor patterns of the wiring layers L1 and L2 when through holes are formed in apex portions of a plurality of lands formed on the wiring layer L1, according to the embodiment of the disclosure.

For example, when junctions between the lands are cut only for the lands 201A formed on the wiring layer L1, as depicted in FIG. 10A, the apex portions of the plurality of lands 201A formed on the wiring layer L1 are each drilled by a drill to form the through holes 22. Even when the apex portions of the lands 201A are each drilled, junctions between the lands are not cut for the lands 201B.

Figure 10B:
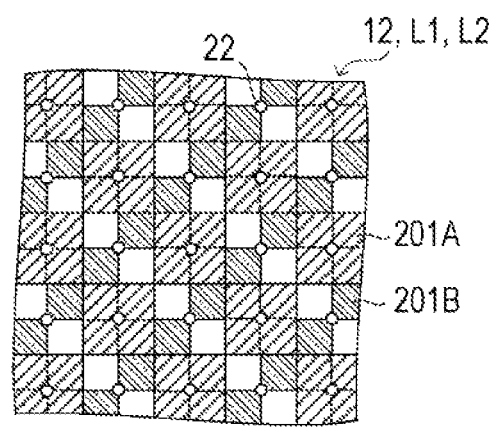
FIG. 10B is a diagram of the stacked conductor patterns of the wiring layers L1 and L2 when through holes are formed in apex portions of a plurality of lands formed on the wiring layer L2, according to the embodiment of the disclosure.

On the other hand, when the junctions between the lands are cut only for the lands 201B formed on the wiring layer L2, as depicted in FIG. 10B, the apex portions of the plurality of lands 201B formed on the wiring layer L2 are each drilled by a drill to form the through holes 22. Even when the apex portions of the lands 201B are each drilled, the junctions between the lands are not cut for the lands 201A.

Figure 10C:
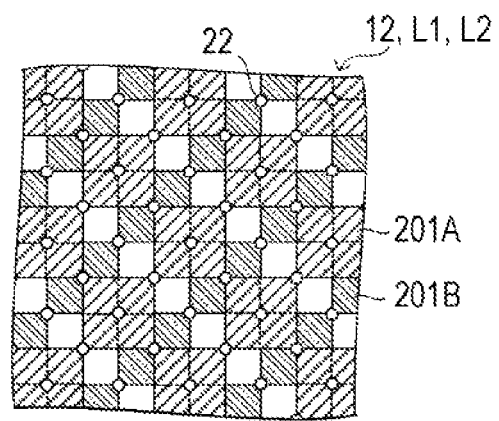
FIG. 10C is a diagram of the stacked conductor patterns of the wiring layers L1 and L2 when through holes are formed in apex portions of a plurality of lands formed on the wiring layers L1 and L2, according to the embodiment of the disclosure.

Furthermore, when the junctions between the lands are cut for both of the lands 201A and 201B formed on the wiring layers L1 and L2, respectively, as depicted in FIG. 10C, the apex portions of the plurality of lands 201A and 2016 are each drilled by a drill to form the through holes 22.

As described above, the wiring board manufacturing method of the fifth embodiment of the disclosure includes the following: (1) forming a conductor pattern on at least two wiring layers of the waste board section 12 of the wiring board 10, the conductor pattern in which the plurality of quadrangular lands configured of a conductor are arranged along the X and Y directions so as to each make contact with an adjacent land at each apex; (2) forming the conductor pattern in which the plurality of lands 2016 are arranged on the wiring layer L2 so as to be shifted in the X and Y directions with respect to the plurality of lands 201A arranged on the wiring layer L1; and (3) removing, by drilling, the conductor at apex portions of at least part of the plurality of lands 201A and 2016 arranged on at least one of the wiring layers L1 and L2.

According to the wiring board manufacturing method of the fifth embodiment of the disclosure, cutting junctions between the lands on the wiring layer L1 and cutting junctions between the lands on the wiring layer L2 are allowed to be independently performed. For example, when the wiring board 10 is warped to a wiring layer L1 side, the apex portions of the lands 201A formed on the wiring layer L1 are drilled to suppress warpage of the wiring board 10. Similarly, when the wiring board 10 is warped to a wiring layer L2 side, the apex portions of the lands 2016 formed on the wiring layer L2 are drilled to suppress warpage of the wiring board 10. Also, by confirming the status of occurrence of warpage by sequentially changing the wiring layer where junctions between the lands are to be cut, the wiring layer which causes warpage is grasped.

Sixth Embodiment

Figure 11A:
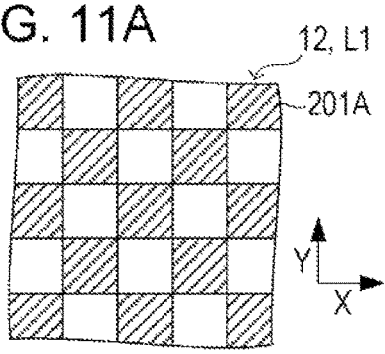
FIG. 11A is a plan view of a conductor pattern formed on the wiring layer L1 of the waste board section according to an embodiment of the disclosure.
Figure 11D:
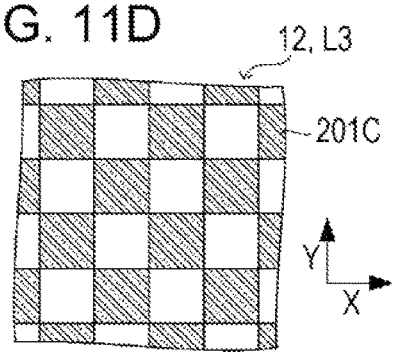
FIG. 11D is a plan view of a conductor pattern formed on a wiring layer L3 of the waste board section according to the embodiment of the disclosure.
Figure 11B:
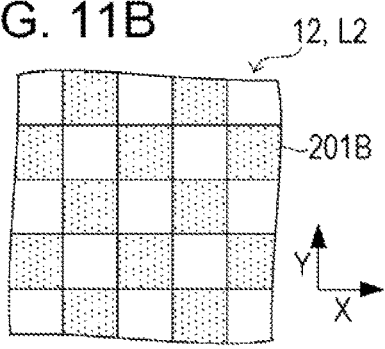
FIG. 11B is a plan view of a conductor pattern formed on the wiring layer L2 of the waste board section according to the embodiment of the disclosure.
Figure 11E:
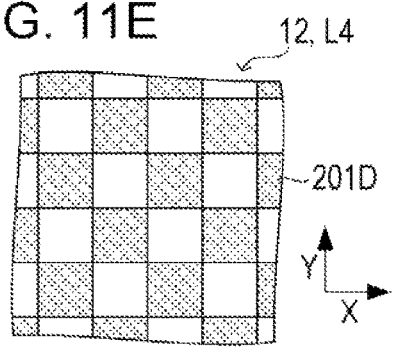
FIG. 11E is a plan view of a conductor pattern formed on a wiring layer L4 of the waste board section according to the embodiment of the disclosure.
Figure 11C:
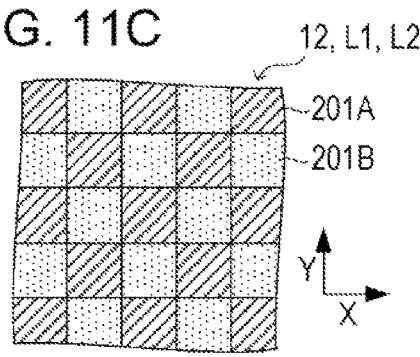
FIG. 11C is a diagram of the stacked conductor patterns of the wiring layers L1 and L2 of the waste board section according to the embodiment of the disclosure.
Figure 11F:
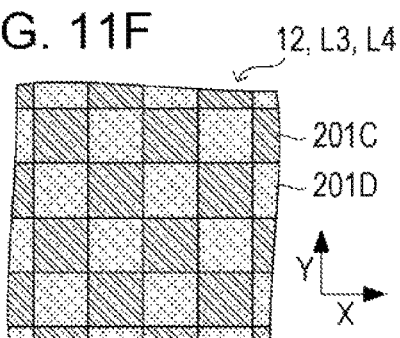
FIG. 11F is a diagram of the stacked conductor patterns of the wiring layers L3 and L4 of the waste board section according to the embodiment of the disclosure.
Figure 11G:
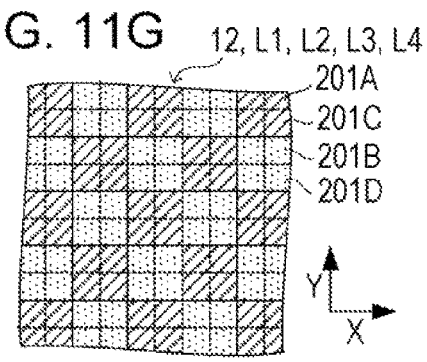
FIG. 11G is a diagram of the stacked conductor patterns of the wiring layers L1 to L4 according to the embodiment of the disclosure.

FIG. 11A, FIG. 11B, FIG. 11C, FIG. 11D, FIG. 11E, FIG. 11F, and FIG. 11G are plan views of conductor patterns on the respective wiring layers of the waste board section 12 according to a sixth embodiment of the disclosure. Specifically, FIG. 11A is a plan view of a conductor pattern formed on the wiring layer L1 of the waste board section 12. FIG. 11B is a plan view of a conductor pattern formed on the wiring layer L2 of the waste board section 12. FIG. 11C is a diagram of the stacked conductor patterns of the wiring layers L1 and L2 of the waste board section 12. FIG. 11D is a plan view of a conductor pattern formed on the wiring layer L3 of the waste board section 12. FIG. 11E is a plan view of a conductor pattern formed on the wiring layer L4 of the waste board section 12. FIG. 11F is a diagram of the stacked conductor patterns of the wiring layers L3 and L4 of the waste board section 12. FIG. 11G is a diagram of the stacked conductor patterns of the wiring layers L1 to L4. Note that while the conductor patterns of the other wiring layers L5 to L10 are not particularly limited, the conductor pattern formed on any of the wiring layers L1 to L4 may be applied as appropriate. Also, the conductor pattern according to the above-described first or second embodiment may be applied to any of the wiring layers.

On the wiring layers L1 to L4 of the waste board section 12, a conductor pattern of a lattice pattern is formed in which a plurality of quadrangular (square) lands 201A, 201B, 201C, and 201D, respectively, configured of a conductor are cyclically arrayed along the X and Y directions so as to each make contact with an adjacent land at each apex.

The plurality of lands 201B formed on the wiring layer L2 are arranged so as to be shifted in the X and Y directions, with respect to the plurality of lands 201A formed on the wiring layer L1, by a shift amount corresponding to a half of a repetition cycle of the plurality of lands. That is, the conductor pattern on the wiring layer L2 corresponds to a pattern which is obtained by reversing land formation sections and land non-formation sections of the conductor pattern on the wiring layer L1. By shifting the arrangements of the lands 201A and the lands 201B by a half cycle, as depicted in FIG. 11C, the positions of the apexes of the lands 201A in the X and Y directions and the positions of the apexes of the lands 201B in the X and Y directions match each other. That is, the junctions between the lands 201A and the junctions between the lands 201B match each other in the X and Y directions.

The plurality of lands 201C formed on the wiring layer L3 are arranged so as to be shifted in the X and Y directions with respect to the plurality of lands 201A formed on the wiring layer L1 by a shift amount corresponding to a quarter of the repetition cycle of the plurality of lands.

The plurality of lands 201D formed on the wiring layer L4 are arranged so as to be shifted in the X and Y directions with respect to the plurality of lands 201C formed on the wiring layer L3 by a shift amount corresponding to a half of a repetition cycle of the plurality of lands. That is, the conductor pattern on the wiring layer L4 corresponds to a pattern which is obtained by reversing land formation sections and land non-formation sections of the conductor pattern on the wiring layer L3. In other words, the plurality of lands 201D formed on the wiring layer L4 are arranged so as to be shifted in the X and Y directions with respect to the plurality of lands 201A formed on the wiring layer L1 by a shift amount corresponding to a third quarter of the repetition cycle of the plurality of lands. By shifting the arrangements of the lands 201C and the lands 201D by a half cycle, as depicted in FIG. 11F, the positions of the apexes of the lands 201C in the X and Y directions and the positions of the apexes of the lands 201D in the X and Y directions match each other. That is, the junctions between the lands 201C and the junctions between the lands 201D match each other in the X and Y directions.

Also, by shifting the lands 201A to 201D formed on the wiring layers L1 to L4, respectively, in the above-described manner, as depicted in FIG. 11G, the positions of the apexes of the lands 201A and 201B in the X and Y directions and the positions of the apexes of the lands 201C and 201D in the X and Y directions are shifted. That is, each junction between the lands 201A and each junction between the lands 201B are positioned at the center of the land 201C or 201D, and each junction between the lands 201C and each junction between the lands 201D are positioned at the center of the land 201A or 201B.

After the conductor patterns including the plurality of lands 201A, 201B, 201C, and 201D are formed on the wiring layers L1 to L4, respectively, of the waste board section 12, junctions between the lands are cut as appropriate in each of the wiring layers L1 to L4, thereby suppressing warpage of the wiring board 10. By shifting the positions of the lands 201A to 201D from one another in the manner as described above, cutting junctions between the lands 201A and between the lands 201B and cutting junctions between the lands 201C and between the lands 201D are allowed to be independently performed.

Figure 12A:
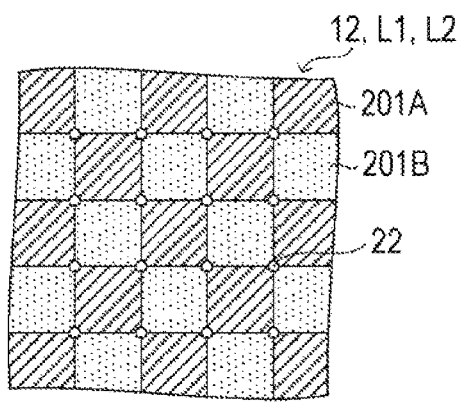
FIG. 12A is a diagram of the stacked conductor patterns of the wiring layers L1 and L2 when through holes are formed in apex portions of a plurality of lands formed on the wiring layers L1 and L2, according to the embodiment of the disclosure.
Figure 12B:
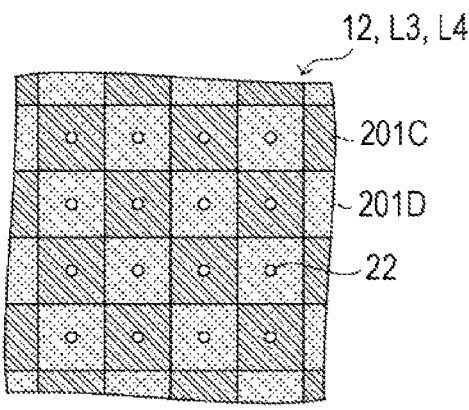
FIG. 12B is a diagram of the stacked conductor patterns of the wiring layers L3 and L4 when through holes are formed in apex portions of the plurality of lands formed on the wiring layers L1 and L2, according to the embodiment of the disclosure.

For example, when junctions between the lands are cut only for the lands 201A and 201B, as depicted in FIG. 12A, the apex portions of the lands 201A and 201B are each drilled by a drill to form the through holes 22. Here, FIG. 12A is a diagram of the stacked conductor patterns of the wiring layers L1 and L2 when the through hole 22 is formed in each apex portion of the lands 201A and 201B. Since the positions of the apexes of the lands 201A in the X and Y directions and the positions of the apexes of the lands 201B in the X and Y directions match each other, the apex portions of the lands 201A and 201B may be collectively drilled. As depicted in FIG. 12B, even when the apex portions of the lands 201A and 201B are each drilled, junctions between the lands for the lands 201C and 201D are not cut. Here, FIG. 12B is a diagram of the stacked conductor patterns of the wiring layers L3 and L4 when the through hole 22 is formed in each apex portion of the lands 201A and 201B.

Figure 12C:
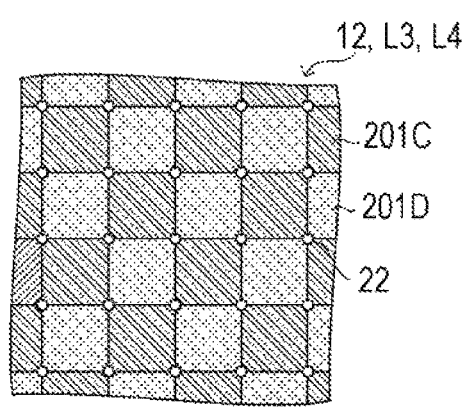
FIG. 12C is a diagram of the stacked conductor patterns of the wiring layers L3 and L4 when through holes are formed in apex portions of a plurality of lands formed on the wiring layers L3 and L4, according to the embodiment of the disclosure.
Figure 12D:
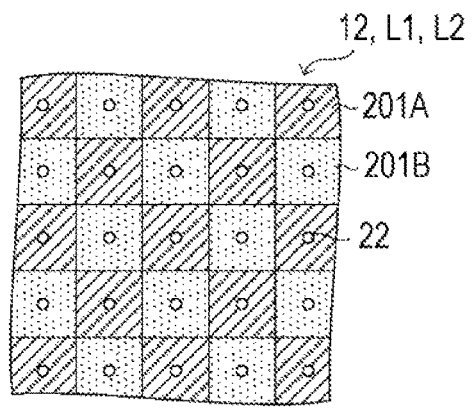
FIG. 12D is a diagram of the stacked conductor patterns of the wiring layers L1 and L2 when through holes are formed in apex portions of the plurality of lands formed on the wiring layers L3 and L4, according to the embodiment of the disclosure.

On the other hand, when junctions between the lands are cut only for the lands 201C and 201D, as depicted in FIG. 12C, the apex portions of the lands 201C and 201D are each drilled by a drill to form the through holes 22. Here, FIG. 12C is a diagram of the stacked conductor patterns of the wiring layers L3 and L4 when the through hole 22 is formed in each apex portion of the lands 201C and 201D. Since the positions of the apexes of the lands 201C in the X and Y directions and the positions of the apexes of the lands 201D in the X and Y directions match each other, the apex portions of the lands 201C and 201D may be collectively drilled. As depicted in FIG. 12D, even when the apex portions of the lands 201C and 201D are drilled, junctions between the lands for the lands 201A and 201B are not cut. Here, FIG. 12D is a diagram of the stacked conductor patterns of the wiring layers L1 and L2 when the through hole 22 is formed in each apex portion of the lands 201C and 201D.

Furthermore, junctions between lands are cut for the lands 201A, 201B, 201C, and 201D, the apex portions of the lands 201A, 201B, 201C, and 201D are each drilled by a drill to form the through holes 22.

As described above, the wiring board manufacturing method of the sixth embodiment of the disclosure includes the following: (1) forming a conductor pattern on each of a plurality of wiring layers of the waste board section 12 of the wiring board 10, the conductor pattern in which the plurality of quadrangular lands configured of a conductor are cyclically arranged along the X and Y directions so as to each make contact with an adjacent land at each apex; (2) forming a conductor pattern on the second wiring layer L2, the conductor pattern in which the plurality of lands 201B are cyclically arranged so as to be shifted in the X and Y directions with respect to the plurality of lands 201A arranged on the first wiring layer L1 by a shift amount corresponding to a half of a repetition cycle of the plurality of lands; (3) forming a conductor pattern on the third wiring layer L3, the conductor pattern in which the plurality of lands 201C are cyclically arranged so as to be shifted in the X and Y directions with respect to the plurality of lands 201A arranged on the first wiring layer L1 by a shift amount corresponding to a quarter of the repetition cycle of the plurality of lands; (4) forming a conductor pattern on the fourth wiring layer L4, the conductor pattern in which the plurality of lands 201D are cyclically arranged so as to be shifted in the X and Y directions with respect to the plurality of lands 201A arranged on the first wiring layer L1 by a shift amount corresponding to a third quarter of the repetition cycle of the plurality of lands; and (5) removing, by drilling to form through holes, the conductor at apex portions of at least part of the plurality of lands arranged on the first to fourth wiring layers L1 to L4.

According to the wiring board manufacturing method of the sixth embodiment of the disclosure, cutting junctions between the lands on the wiring layers L1 and L2 and cutting junctions between the lands on the wiring layers L3 and L4 are allowed to be independently performed.

Also, by shifting each of the conductor patterns on the wiring layers L1 to L4 at quarter-cycle intervals as described above, lands of two layers are multilayered at any point in the waste board section 12. With this, when the wiring layers of the wiring board are multilayered, a flow of resin configuring the insulating layer 14 is made uniform, thereby making the insulating layer 14 and the conductor well balanced and suppressing warpage of the wiring board. Note that the sequence of multilayering the conductor patterns formed on the wiring layers L1 to L4 described above may be changed as appropriate.

Seventh Embodiment

Figure 13A:
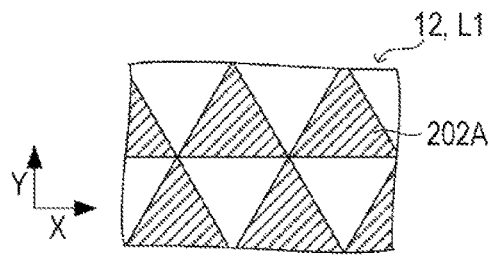
FIG. 13A is a plan view of a conductor pattern formed on the wiring layer L1 of the waste board section according to an embodiment of the disclosure.
Figure 13B:
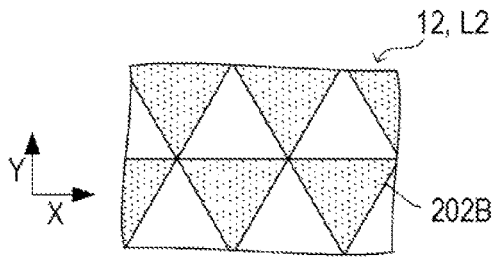
FIG. 13B is a plan view of a conductor pattern formed on the wiring layer L2 of the waste board section according to the embodiment of the disclosure.
Figure 13C:
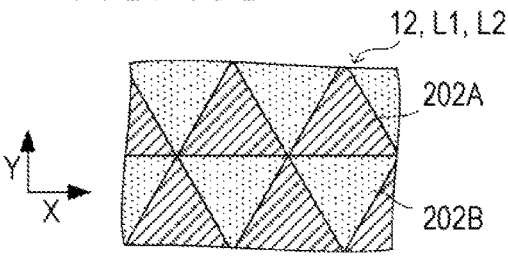
FIG. 13C is a diagram of the stacked conductor patterns of the wiring layers L1 and L2 of the waste board section according to the embodiment of the disclosure.
Figure 13D:
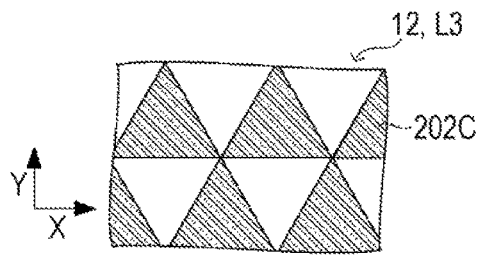
FIG. 13D is a plan view of a conductor pattern formed on the wiring layer L3 of the waste board section according to the embodiment of the disclosure.
Figure 13E:
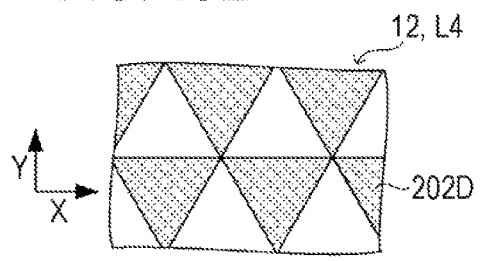
FIG. 13E is a plan view of a conductor pattern formed on the wiring layer L4 of the waste board section according to the embodiment of the disclosure.
Figure 13F:
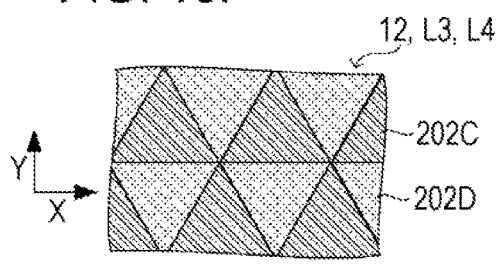
FIG. 13F is a diagram of the stacked conductor patterns of the wiring layers L3 and L4 of the waste board section according to the embodiment of the disclosure.
Figure 13G:
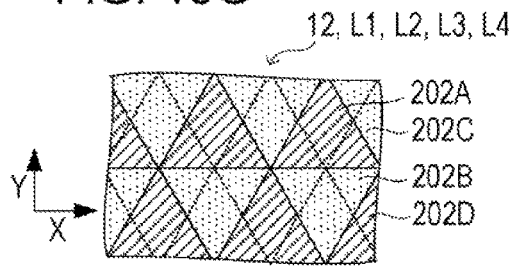
FIG. 13G is a diagram of the stacked conductor patterns of the wiring layers L1 to L4 according to the embodiment of the disclosure.

FIG. 13A, FIG. 13B, FIG. 13C, FIG. 13D, FIG. 13E, FIG. 13F, and FIG. 13G are plan views of conductor patterns of the waste board section 12 according to a seventh embodiment of the disclosure. Specifically, FIG. 13A is a plan view of a conductor pattern formed on the wiring layer L1 of the waste board section 12. FIG. 13B is a plan view of a conductor pattern formed on the wiring layer L2 of the waste board section 12. FIG. 13C is a diagram of the stacked conductor patterns of the wiring layers L1 and L2 of the waste board section 12. FIG. 13D is a plan view of a conductor pattern formed on the wiring layer L3 of the waste board section 12. FIG. 13E is a plan view of a conductor pattern formed on the wiring layer L4 of the waste board section 12. FIG. 13F is a diagram of the stacked conductor patterns of the wiring layers L3 and L4 of the waste board section 12. FIG. 13G is a diagram of the stacked conductor patterns of the wiring layers L1 to L4. Note that while the conductor patterns of the other wiring layers L5 to L10 are not particularly limited, the conductor pattern formed on any of the wiring layers L1 to L4 may be applied as appropriate. Also, the conductor pattern according to the above-described first or second embodiment may be applied to any of the wiring layers.

As depicted in FIG. 13A to FIG. 13G, on the wiring layers L1 to L4, conductor patterns are formed in which the lands 201A to 201D depicted in FIG. 11A to FIG. 11G are replaced by the triangular (equilateral triangular) lands 202A to 202D.

The plurality of lands 202B formed on the wiring layer L2 are arranged so as to be shifted in the X and Y directions with respect to the plurality of lands 202A formed on the wiring layer L1 by a shift amount corresponding to a half of a repetition cycle of the plurality of lands. The plurality of lands 202C formed on the wiring layer L3 are arranged so as to be shifted in the X and Y directions with respect to the plurality of lands 202A formed on the wiring layer L1 by a shift amount corresponding to a quarter of the repetition cycle of the plurality of lands. The plurality of lands 202D formed on the wiring layer L4 are arranged so as to be shifted in the X and Y directions with respect to the plurality of lands 202A formed on the wiring layer L1 by a shift amount corresponding to a third quarter of the repetition cycle of the plurality of lands.

By shifting the lands 202A to 202D formed on the wiring layers L1 to L4, respectively, in the manner as described above, as depicted in FIG. 13G, the positions of the apexes of the lands 202A and 202B in the X and Y directions and the positions of the apexes of the lands 202C and 202D in the X and Y directions are shifted. That is, each junction between the lands 202A and between the lands 202B is positioned at the center of a side of the land 202C or 202D, and each junction between the lands 202C and between the lands 202D is positioned at the center of a side of the land 202A or 202B.

After the conductor patterns including the plurality of lands 202A, 202B, 202C, and 202D are formed on the wiring layers L1 to L4, respectively, of the waste board section 12, junctions between the lands are cut as appropriate in each of the wiring layers L1 to L4, thereby suppressing warpage of the wiring board 10. By shifting the positions of the lands 202A to 202D from one another in the manner as described above, cutting junctions between the lands 202A and between the lands 202B and cutting junctions between the lands 202C and between the lands 202D are allowed to be independently performed.

Figure 14A:
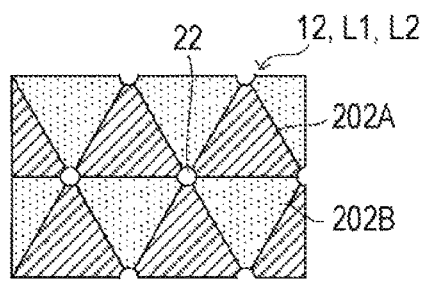
FIG. 14A is a diagram of the stacked conductor patterns of the wiring layers L1 and L2 when through holes are formed in apex portions of a plurality of lands formed on the wiring layers L1 and L2, according to the embodiment of the disclosure.

For example, when junctions between the lands are cut only for the lands 202A and 202B, as depicted in FIG. 14A, the apex portions of the lands 202A and 202B are each drilled by a drill to form the through holes 22. Here, FIG. 14A is a diagram of the stacked conductor patterns of the wiring layers L1 and L2 when the through hole 22 is formed in each apex portion of the lands 202A and 202B. Since the positions of the apexes of the lands 202A in the X and Y directions and the positions of the apexes of the lands 202B in the X and Y directions match each other, the apex portions of the lands 202A and 202B may be collectively drilled. As depicted in FIG. 14B, even when the apex portions of the lands 202A and 202B are each drilled, junctions between lands are not cut for the lands 202C and 202D. Here, FIG. 14B is a diagram of the stacked conductor patterns of the wiring layers L3 and L4 when the through hole 22 is formed in each apex portion of the lands 202A and 202B.

Figure 14C:
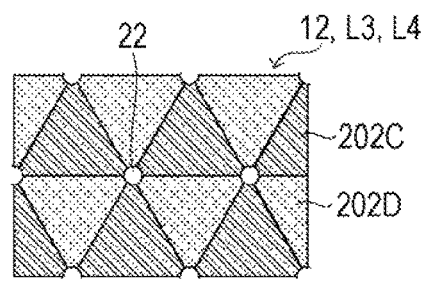
FIG. 14C is a diagram of the stacked conductor patterns of the wiring layers L3 and L4 when through holes are formed in apex portions of a plurality of lands formed on the wiring layers L3 and L4, according to the embodiment of the disclosure.
Figure 14B:
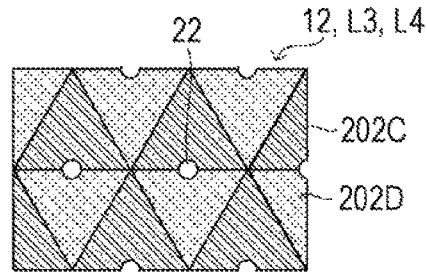
FIG. 14B is a diagram of the stacked conductor patterns of the wiring layers L3 and L4 when through holes are formed in apex portions of the plurality of lands formed on the wiring layers L1 and L2, according to the embodiment of the disclosure.
Figure 14D:
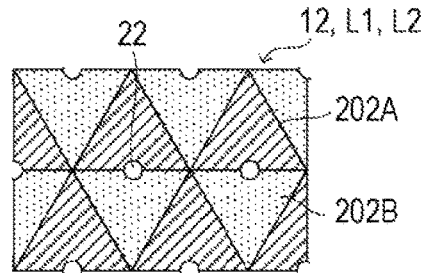
FIG. 14D is a diagram of the stacked conductor patterns of the wiring layers L1 and L2 when through holes are formed in apex portions of the plurality of lands formed on the wiring layers L3 and L4, according to the embodiment of the disclosure.

On the other hand, when junctions between the lands are cut only for the lands 202C and 202D, as depicted in FIG. 14C, the apex portions of the lands 202C and 202D are each drilled by a drill to form the through holes 22. Here, FIG. 14C is a diagram of the stacked conductor patterns of the wiring layers L3 and L4 when the through hole 22 is formed in each apex portion of the lands 202C and 202D. Since the positions of the apexes of the lands 202C in the X and Y directions and the positions of the apexes of the lands 202D in the X and Y directions match each other, the apex portions of the lands 202C and 202D may be collectively drilled. As depicted in FIG. 14D, even when the apex portions of the lands 202C and 202D are each drilled, junctions between lands are not cut for the lands 202A and 202B. Here, FIG. 14D is a diagram of the stacked conductor patterns of the wiring layers L1 and L2 when the through hole 22 is formed in each apex portion of the lands 202C and 202D.

Furthermore, when junctions between lands are cut for the lands 202A, 202B, 202C, and 202D, the apex portions of the lands 202A, 202B, 202C, and 202D are each drilled by a drill to form the through holes 22.

As described above, the wiring board manufacturing method of the seventh embodiment of the disclosure is similar to the wiring board manufacturing method of the above-described sixth embodiment except that each of the lands arranged on the wiring layers L1 to L4 has a triangular (equilateral triangular) shape.

According to the wiring board manufacturing method of the seventh embodiment of the disclosure, cutting junctions between the lands on the wiring layers L1 and L2 and cutting junctions between the lands on the wiring layers L3 and L4 are allowed to be independently performed.

Also, by shifting each of the conductor patterns on the wiring layers L1 to L4 at quarter-cycle intervals as described above, lands of two layers are multilayered at any point in the waste board section 12. With this, when the wiring layers of the wiring board are multilayered, a flow of resin configuring the insulating layer 14 is made uniform, thereby making the insulating layer 14 and the conductor well balanced and suppressing warpage of the wiring board.

Eighth Embodiment

Figure 15:
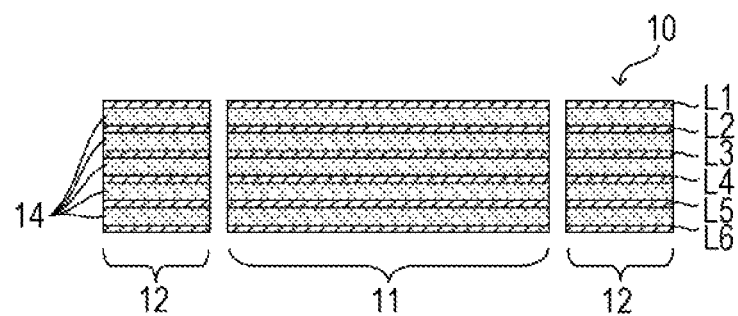
FIG. 15 is a sectional view of the structure of the wiring board according to an embodiment of the disclosure.

A wiring board according to an eighth embodiment of the disclosure is an example of suitable combinations of the conductor patterns on the wiring layers of the waste board section 12 of the wiring board according to each of the above-described embodiments. Note that, in the present embodiment, the wiring layers of the wiring board 10 are assumed to have a six-layer structure formed of wiring layers L1 to L6, as depicted in FIG. 15. That is, the wiring layers L1 and L6 correspond to outer layers in a multilayered wiring board and the wiring layers L2 to L5 correspond to inner layers in the multilayered wiring board.

FIG. 16A, FIG. 16B, FIG. 16C, FIG. 16D, FIG. 16E, and FIG. 16F are plan views of conductor patterns on the wiring layers L1, L2, L3, L4, L5 and L6, respectively, of the waste board section 12 of the wiring board 10 according to the present embodiment.

Figure 16A:
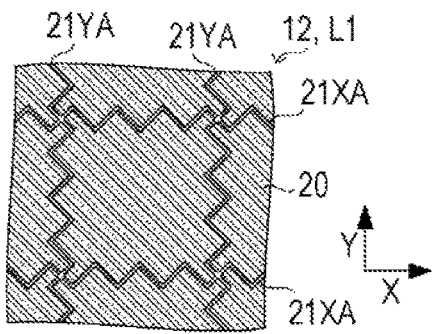
FIG. 16A is a plan view of a conductor pattern formed on the wiring layer L1 of a waste board section according to the embodiment of the disclosure.

As depicted in FIG. 16A, the conductor pattern formed on the wiring layer L1 is identical to the conductor pattern depicted in FIG. 6A. That is, on the wiring layer L1, the conductor pattern including the slits in a mesh structure in which the slits 21YA in a zigzag pattern extending in the Y direction and the slits 21XA in a zigzag pattern extending in the X direction cross one another is formed.

Figure 16D:
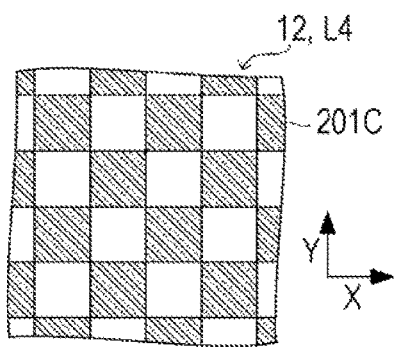
FIG. 16D is a plan view of a conductor pattern formed on the wiring layer L4 of the waste board section according to the embodiment of the disclosure.
Figure 16B:
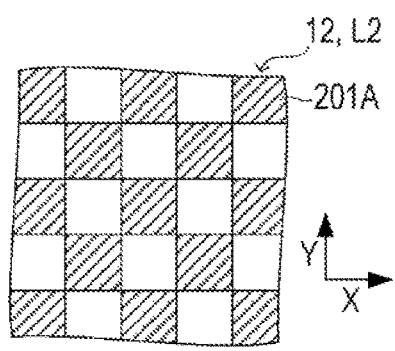
FIG. 16B is a plan view of a conductor pattern formed on the wiring layer L2 of the waste board section according to the embodiment of the disclosure.

As depicted in FIG. 16B, the conductor pattern formed on the wiring layer L2 is identical to the conductor pattern depicted in FIG. 11A. That is, on the wiring layer L2, the conductor pattern of a lattice pattern including the plurality of quadrangular lands 201A is formed.

Figure 16E:
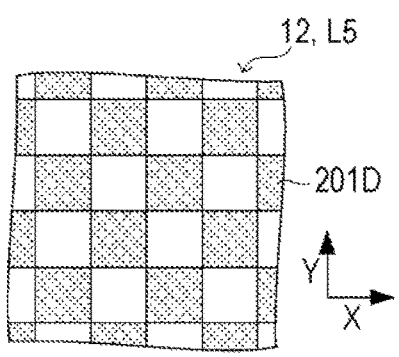
FIG. 16E is a plan view of a conductor pattern formed on a wiring layer L5 of the waste board section according to the embodiment of the disclosure.
Figure 16C:
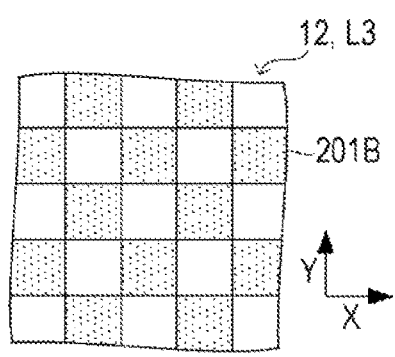
FIG. 16C is a plan view of a conductor pattern formed on the wiring layer L3 of the waste board section according to the embodiment of the disclosure.

As depicted in FIG. 16C, the conductor pattern formed on the wiring layer L3 is identical to the conductor pattern depicted in FIG. 11B. That is, on the wiring layer L3, the conductor pattern of a lattice pattern including the plurality of quadrangular lands 201B is formed. The plurality of lands 201B are shifted in the X and Y directions with respect to the plurality of lands 201A formed on the wiring layer L2 by a shift amount corresponding to a half of the repetition cycle of the plurality of lands.

As depicted in FIG. 16D, the conductor pattern formed on the wiring layer L4 is identical to the conductor pattern depicted in FIG. 11D. That is, on the wiring layer L4, the conductor pattern of a lattice pattern including the plurality of quadrangular lands 201C is formed. The plurality of lands 201C are shifted in the X and Y directions with respect to the plurality of lands 201A formed on the wiring layer L2 by a shift amount corresponding to a quarter of the repetition cycle of the plurality of lands.

As depicted in FIG. 16E, the conductor pattern formed on the wiring layer L5 is identical to the conductor pattern depicted in FIG. 11E. That is, on the wiring layer L5, the conductor pattern of a lattice pattern including the plurality of quadrangular lands 201D is formed. The plurality of lands 201D are shifted in the X and Y directions with respect to the plurality of lands 201A formed on the wiring layer L2 by a shift amount corresponding to a third quarter of the repetition cycle of the plurality of lands.

Figure 16F:
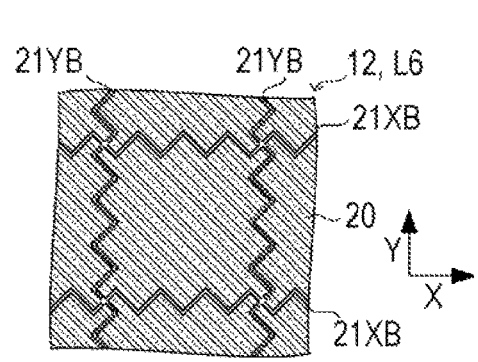
FIG. 16F is a plan view of a conductor pattern formed on a wiring layer L6 of the waste board section according to the embodiment of the disclosure.

As depicted in FIG. 16F, the conductor pattern formed on the wiring layer L6 is identical to the conductor pattern depicted in FIG. 6B. That is, on the wiring layer L6, the conductor pattern including slits in a mesh structure in which the slits 21YB in a zigzag pattern extending in the Y direction and the slits 21X6 in a zigzag pattern extending in the X direction cross one another is formed. The zigzag pattern of each slit 21YB is shifted in the Y direction with respect to the zigzag pattern of each slit 21YA in the wiring layer L1 by a shift amount corresponding to a half of the repetition cycle of the zigzag pattern. Similarly, the zigzag pattern of each slit 21X6 is shifted in the X direction with respect to the zigzag pattern of each slit 21XA in the wiring layer L1 by a shift amount corresponding to a half of the repetition cycle of the zigzag pattern.

After the above-described conductor patterns are respectively formed on the wiring layers L1 to L6 of the waste board section 12, junctions between the lands in the wiring layers L2 to L5 are cut as appropriate by drilling by a drill, thereby suppressing warpage of the wiring board 10. By shifting the arrangements of the lands 201A to 201D from one another in the manner as described above, cutting junctions between the lands 201A and between the lands 201B and cutting junctions between the lands 201C and between the lands 201D are allowed to be independently performed.

Ninth Embodiment

A wiring board according to a ninth embodiment of the disclosure is another example of the suitable combinations of the conductor patterns on the wiring layers of the waste board section 12 of the wiring board according to each of the above-described embodiments. Note that, in the present embodiment, the wiring layers of the wiring board 10 are assumed to have a ten-layer structure formed of wiring layers L1 to L10, as depicted in FIG. 1B. That is, the wiring layers L1 and L10 correspond to outer layers in a multilayered wiring board and the wiring layers L2 to L9 correspond to inner layers in the multilayered wiring board.

FIG. 17A, FIG. 17B, FIG. 17C, FIG. 17D, FIG. 17E, FIG. 17F, FIG. 17G, FIG. 17H, FIG. 17I, and FIG. 17J are plan views of conductor patterns formed on the wiring layers L1, L2, L3, L4, L5, L6, L7, L8, L9, and L10, respectively, of the waste board section 12.

Figure 17A:
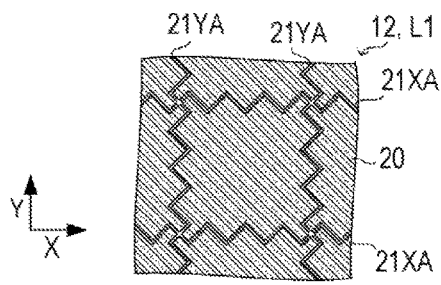
FIG. 17A is a plan view of a conductor pattern formed on the wiring layer L1 of a waste board section according to an embodiment of the disclosure.

As depicted in FIG. 17A, the conductor pattern formed on the wiring layer L1 is identical to the conductor pattern depicted in FIG. 6A. That is, on the wiring layer L1, the conductor pattern including the slits in a mesh structure in which the slits 21YA in a zigzag pattern extending in the Y direction and the slits 21XA in a zigzag pattern extending in the X direction cross one another is formed.

Figure 17B:
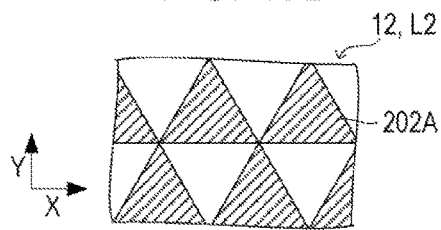
FIG. 17B is a plan view of a conductor pattern formed on the wiring layer L2 of the waste board section according to the embodiment of the disclosure.

As depicted in FIG. 17B, the conductor pattern formed on the wiring layer L2 is identical to the conductor pattern depicted in FIG. 13A. That is, on the wiring layer L2, the conductor pattern including the plurality of triangular lands 202A is formed.

Figure 17C:
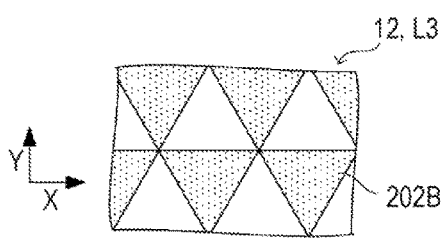
FIG. 17C is a plan view of a conductor pattern formed on the wiring layer L3 of the waste board section according to the embodiment of the disclosure.

As depicted in FIG. 17C, the conductor pattern formed on the wiring layer L3 is identical to the conductor pattern depicted in FIG. 13B. That is, on the wiring layer L3, the conductor pattern including the plurality of triangular lands 202B is formed. The plurality of lands 202B are shifted in the X and Y directions with respect to the plurality of lands 202A formed on the wiring layer L2 by a shift amount corresponding to a half of the repetition cycle of the plurality of lands.

Figure 17D:
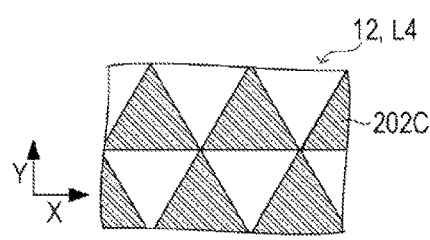
FIG. 17D is a plan view of a conductor pattern formed on the wiring layer L4 of the waste board section according to the embodiment of the disclosure.

As depicted in FIG. 17D, the conductor pattern formed on the wiring layer L4 is identical to the conductor pattern depicted in FIG. 13D. That is, on the wiring layer L4, the conductor pattern including the plurality of triangular lands 202C is formed. The plurality of lands 202C are shifted in the X and Y directions with respect to the plurality of lands 202A formed on the wiring layer L2 by a shift amount corresponding to a quarter of the repetition cycle of the plurality of lands.

Figure 17E:
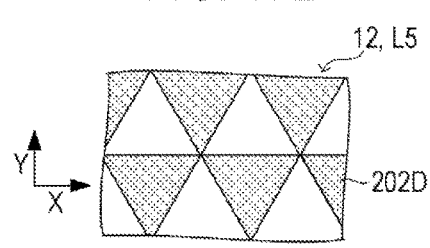
FIG. 17E is a plan view of a conductor pattern formed on the wiring layer L5 of the waste board section according to the embodiment of the disclosure.

As depicted in FIG. 17E, the conductor pattern formed on the wiring layer L5 is identical to the conductor pattern depicted in FIG. 13E. That is, on the wiring layer L5, the conductor pattern including the plurality of triangular lands 202D is formed. The plurality of lands 202D are shifted in the X and Y directions with respect to the plurality of lands 202A formed on the wiring layer L2 by a shift amount corresponding to a third quarter of the repetition cycle of the plurality of lands.

Figure 17F:
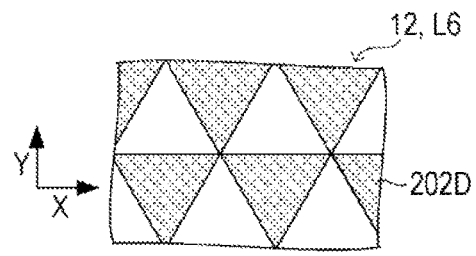
FIG. 17F is a plan view of a conductor pattern formed on the wiring layer L6 of the waste board section according to the embodiment of the disclosure.

As depicted in FIG. 17F, the conductor pattern formed on the wiring layer L6 is identical to the conductor pattern formed on the wiring layer L5.

Figure 17I:
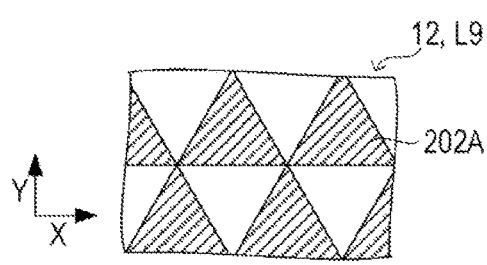
FIG. 17I is a plan view of a conductor pattern formed on a wiring layer L9 of the waste board section according to the embodiment of the disclosure.
Figure 17G:
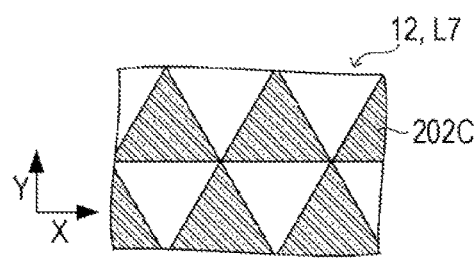
FIG. 17G is a plan view of a conductor pattern formed on a wiring layer L7 of the waste board section according to the embodiment of the disclosure.

As depicted in FIG. 17G, the conductor pattern formed on the wiring layer L7 is identical to the conductor pattern formed on the wiring layer L4.

Figure 17J:
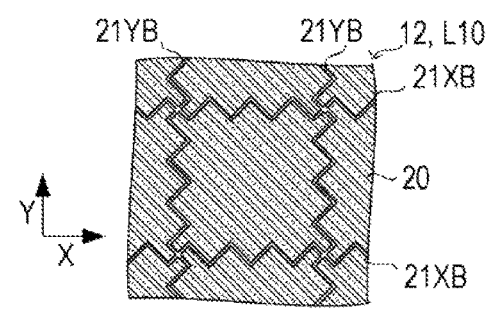
FIG. 17J is a plan view of a conductor pattern formed on a wiring layer L10 of the waste board section according to the embodiment of the disclosure.
Figure 17H:
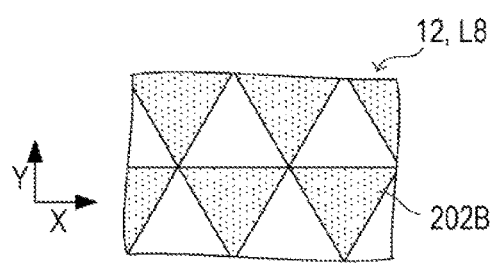
FIG. 17H is a plan view of a conductor pattern formed on a wiring layer L8 of the waste board section according to the embodiment of the disclosure.

As depicted in FIG. 17H, the conductor pattern formed on the wiring layer L8 is identical to the conductor pattern formed on the wiring layer L3.

As depicted in FIG. 17I, the conductor pattern formed on the wiring layer L9 is identical to the conductor pattern formed on the wiring layer L2.

As depicted in FIG. 17J, the conductor pattern formed on the wiring layer L10 is identical to the conductor pattern depicted in FIG. 6B. That is, on the wiring layer L10, the conductor pattern including the slits in a mesh structure in which the slits 21YB in a zigzag pattern extending in the Y direction and the slits 21X6 in a zigzag pattern extending in the X direction cross one another is formed. The zigzag pattern of each slit 21YB in the wiring layer L10 is shifted in the Y direction with respect to the zigzag pattern of each slit 21YA in the wiring layer L1 by a shift amount corresponding to a half of the repetition cycle of the zigzag pattern. Similarly, the zigzag pattern of each slit 21X6 in the wiring layer L10 is shifted in the X direction with respect to the zigzag pattern of each slit 21XA in the wiring layer L1 by a shift amount corresponding to a half of the repetition cycle of the zigzag pattern.

After the above-described conductor patterns are respectively formed on the wiring layers L1 to L10 of the waste board section 12, junctions between the lands in the wiring layers L2 to L9 are cut as appropriate by drilling by a drill, thereby suppressing warpage of the wiring board 10. By shifting the positions of the lands 202A to 202D from one another in the manner as described above, cutting junctions between the lands 202A and between the lands 202B and cutting junctions between the lands 202C and between the lands 202D are allowed to be independently performed.

Also, in the wiring board according to the present embodiment, since the conductor patterns on the wiring layers L1 to L10 of the waste board section 12 are symmetrical in a thickness direction of the wiring board 10, occurrence of warpage of the wiring board 10 may be suppressed.

MODIFICATION EXAMPLES

Figure 18A:
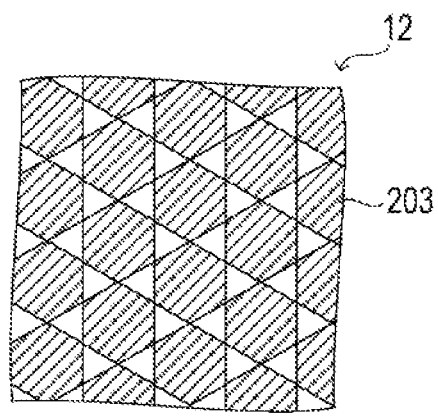
FIG. 18A is a plan view of a conductor pattern of the waste board section according an embodiment of the disclosure.
Figure 18B:
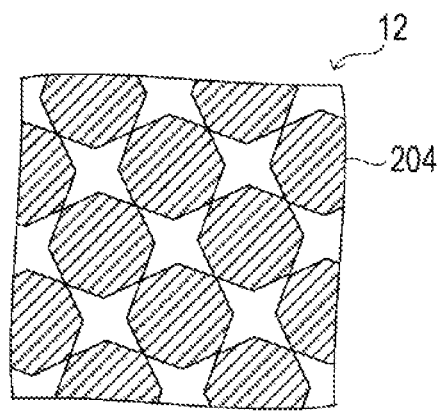
FIG. 18B is a plan view of a conductor pattern of the waste board section according an embodiment of the disclosure.

In the above-described first to ninth embodiments, the case has been exemplarily described in which each of the plurality of lands formed on the waste board section 12 of the wiring board 10 has a quadrangular or triangular shape. However, the embodiments are not restricted thereto. For example, as depicted in FIG. 18A, a plurality of hexagonal (regular hexagonal) lands 203 may be arranged on each wiring layer of the waste board section 12 along the X and Y directions so as to each make contact with an adjacent land at each apex. Also, as depicted in FIG. 18B, a plurality of octagonal (regular octagonal) lands 204 may be arranged on each wiring layer of the waste board section 12 along the X and Y directions so as to each make contact with an adjacent land at four apexes. In this manner, even when hexagonal or octagonal lands are provided, effects similar to those when triangular or quadrangular lands are provided may be obtained. The hexagonal or octagonal lands are effective when the residual copper rate is set at 50% or higher.

EXAMPLES

Wiring boards of seven types with different combinations of conductor patterns in the respective wiring layers of the waste board section and with different through-hole formation states to remove junctions between lands were fabricated, and a warp amount for each wiring board was measured. In the following, the above-mentioned wiring boards of seven types are represented as first to seventh wiring boards. The first to sixth wiring boards are those to which the conductor patterns according to the embodiments of the disclosure are applied to the respective wiring layers of the waste board section, and the seventh wiring board is one to which the conductor patterns according to the comparative examples are applied. The first to seventh wiring boards are multilayered wiring boards having ten wiring layers, with wiring layers L1 and L10 corresponding to outer layers and wiring layers L2 to L9 corresponding to inner layers. Detail structures of the first to seventh wiring boards are as follows.

In the first wiring board, as a conductor pattern of the wiring layers L1 and L10 of the waste board section, the slit 21YA in a zigzag pattern depicted in FIG. 4A was applied. Also, as a conductor pattern of the wiring layers L2 to L9 of the waste board section, the conductor pattern of a lattice pattern including the plurality of quadrangular lands 201 depicted in FIG. 7A was applied. In the first wiring board, the positions of the lands 201 are not shifted among the wiring layers, and the positions of the apexes of the lands 201 (junctions between the lands) in the X and Y directions match among the wiring layers. In the first wiring board, in the wiring layers L2 to L9, through holes were formed at the positions of all apexes of each land 201, and all junctions between the lands were cut.

In the second wiring board, the formation density of through holes to remove junctions between the lands was a quarter of that of the first wiring board. The other structures are similar to those of the first wiring board.

The third wiring board was configured so that through holes to remove junctions between the lands are not formed. The other structures are similar to those of the first wiring board.

The fourth wiring board was configured so that the lands 201 formed on the wiring layers L3, L5, L7, and L9 of the waste board section are shifted in the X and Y directions with respect to the lands 201 formed on the wiring layers L2, L4, L6, and L8 by a shift amount corresponding to a half of the repetition cycle of the lands. The other structures are similar to those of the first wiring board.

In the fifth wiring board, the lands formed on the wiring layers L2 to L9 of the waste board section each have a triangular shape. The other structures are similar to those of the first wiring board.

In the sixth wiring board, as the conductor pattern of the wiring layer L10 of the waste board section, the slit 21YB in a zigzag pattern depicted in FIG. 4B was applied. The other structures are similar to those of the first wiring board.

In the seventh wiring board, as the conductor pattern of the wiring layers L1 and L10 of the waste board section, the straight-line slit 21 depicted in FIG. 2A was applied. Also, as the conductor pattern of the wiring layers L2 to L9 of the waste board section, the slits 21Y and 21X in a mesh structure depicted in FIG. 3 were applied. In the seventh wiring board, the waste board section does not have a through hole.

Ten of each of the first to seventh wiring boards were fabricated, and each warpage amount was measured. Average values of warpage amounts of the first to seventh wiring boards are illustrated in FIG. 19.

It is understood that the warpage amount of each of the first to sixth wiring boards in which the conductor patterns according to the embodiments of the disclosure are applied to the respective wiring layers of the waste board section is smaller than that of the seventh wiring board according to the comparative examples.

As has been described above, according to each wiring board manufacturing method of the embodiments of the disclosure, warpage of the wiring board may be suppressed more simply and effectively than ever. Therefore, occurrence of warpage may be effectively suppressed even in an ultra-thin wiring board such as a wiring board for smartphone where warpage tends to occur. Problems in implementing a dual-sided board or the like where warpage tends to occur may also be mitigated. Also, occurrence of warpage may be effectively suppressed even when a vertically-asymmetrical layer structure where warpage tends to occur is applied. Still further, with warpage of the wiring board suppressed, even when an electronic component with a relatively small terminal pitch is implemented on the wiring board, occurrence of terminal open or solder bridging due to warpage of the wiring board may be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board manufacturing method comprising:
    forming a conductor pattern within a waste board section of a wiring board, the wiring board including a product section and the waste board section with the waste board section being provided on an outer periphery of the product section, the conductor pattern in which a plurality of polygonal lands made of a conductor are arranged in a zigzag pattern, each of the plurality of polygonal lands making contact with an adjacent one of the plurality of polygonal lands at each apex of the plurality of polygonal lands; and
    selectively removing the conductor at the apex of at least part of the plurality of polygonal lands.

2. The manufacturing method according to claim 1, wherein, in the removing, the conductor at the apex of at least part of the plurality of polygonal lands is removed by drilling.

3. The manufacturing method according to claim 2, wherein the wiring board includes a plurality of wiring layers in the product section and the waste board section, and
    in the forming, the conductor pattern is included in at least two of the plurality of wiring layers.

4. The manufacturing method according to claim 3, wherein, in the forming, a conductor pattern is included in at least one of the plurality of wiring layers, the conductor pattern in which the plurality of polygonal lands are arranged so as to be shifted in the first direction and the second direction with respect to the plurality of polygonal lands arranged on another wiring layer.

5. The manufacturing method according to claim 4, wherein, in the removing, a conductor at the apex of at least part of the plurality of polygonal lands arranged on at least one of the wiring layers is removed by drilling.

6. The manufacturing method according to claim 5, wherein, in the removing, the conductor at the apex of at least part of the plurality of polygonal lands arranged on the other wiring layer is further removed by the drilling.

7. The manufacturing method according to claim 3, wherein, in the forming,
    a conductor pattern is formed in a first wiring layer of the plurality of wiring layers, the conductor pattern in which the plurality of polygonal lands are cyclically arranged along the first direction and the second direction,
    a conductor pattern is formed on a second wiring layer of the plurality of wiring layers, the conductor pattern in which the plurality of polygonal lands are cyclically arranged so as to be shifted in the first direction and the second direction with respect to the plurality of polygonal lands arranged in the first wiring layer by a shift amount corresponding to a half of a repetition cycle of the plurality of polygonal lands,
    a conductor pattern is formed on a third wiring layer of the plurality of wiring layers, the conductor pattern in which the plurality of polygonal lands are cyclically arranged so as to be shifted in the first direction and the second direction with respect to the plurality of polygonal lands arranged in the first wiring layer by a shift amount corresponding to a quarter of the repetition cycle of the plurality of polygonal lands, and
    a conductor pattern is formed on a fourth wiring layer of the plurality of wiring layers, the conductor pattern in which the plurality of polygonal lands are cyclically arranged so as to be shifted in the first direction and the second direction with respect to the plurality of polygonal lands arranged in the first wiring layer by a shift amount corresponding to a third quarter of the repetition cycle of the plurality of lands, and
    in the removing,
    the conductor at the apex of at least part of the plurality of polygonal lands arranged on each of the first wiring layer to the fourth wiring layer is removed by forming through holes by the drilling.

8. The manufacturing method according to claim 1, wherein each of the plurality of polygonal lands has a quadrangular shape.

9. The manufacturing method according to claim 1, wherein each of the plurality of polygonal lands has a triangular shape.

10. A wiring board manufacturing method comprising:
    forming a conductor pattern in a first wiring layer of a waste board section of a wiring board, the wiring board including a product section and the waste board section with the waste board section being provided on an outer periphery of the product section, and including a plurality of wiring layers in the product section and the waste board section, the conductor pattern in the first wiring layer including a slit in a zigzag pattern extending in a first direction; and
    forming a conductor pattern on a second wiring layer of the waste board section, the conductor pattern in the second wiring layer including a slit in a zigzag pattern shifted in the first direction with respect to the zigzag pattern of the slit in the first wiring layer and extending in the first direction.

* * * * *